United States Patent
Nakasato et al.

(10) Patent No.: US 8,258,620 B2
(45) Date of Patent: Sep. 4, 2012

(54) CIRCUIT DEVICE, METHOD OF MANUFACTURING THE CIRCUIT DEVICE, DEVICE MOUNTING BOARD AND SEMICONDUCTOR MODULE

(75) Inventors: Mayumi Nakasato, Gifu (JP); Ryosuke Usui, Aichi (JP); Kiyoshi Shibata, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 99 days.

(21) Appl. No.: 12/673,409

(22) PCT Filed: Aug. 8, 2008

(86) PCT No.: PCT/JP2008/002186
§ 371 (c)(1),
(2), (4) Date: Jun. 30, 2010

(87) PCT Pub. No.: WO2009/022461
PCT Pub. Date: Feb. 19, 2009

(65) Prior Publication Data
US 2010/0264552 A1    Oct. 21, 2010

(30) Foreign Application Priority Data

Aug. 10, 2007 (JP) .................................. 2007-210246
Sep. 28, 2007 (JP) .................................. 2007-254714

(51) Int. Cl.
*H01L 23/053* (2006.01)
*H01L 23/12* (2006.01)

(52) U.S. Cl. ................. 257/700; 257/E21.506; 257/758; 257/778; 438/106; 438/125

(58) Field of Classification Search ........... 257/E21.502, 257/E21.506, E23.023, 758, 774, 778, 700; 438/124, 662, 637, 639, 106, 121, 125; 174/258, 174/266, 250, 262
See application file for complete search history.

(56) References Cited

U.S. PATENT DOCUMENTS

| | | | | |
|---|---|---|---|---|
| 6,224,965 B1 * | 5/2001 | Haas et al. | ..................... | 428/209 |
| 6,404,070 B1 * | 6/2002 | Higashi et al. | ................ | 257/796 |
| 6,657,295 B2 * | 12/2003 | Araki | ............... | 257/712 |
| 6,753,483 B2 * | 6/2004 | Andoh et al. | ................. | 174/262 |
| 6,781,064 B1 * | 8/2004 | Appelt et al. | ................. | 174/256 |

(Continued)

FOREIGN PATENT DOCUMENTS

JP    05-074975    3/1993

(Continued)

OTHER PUBLICATIONS

International Search Report issued in International Patent Application No. PCT/JP2008/002186 dated Sep. 9, 2008.

(Continued)

*Primary Examiner* — Chris Chu
(74) *Attorney, Agent, or Firm* — McDermott Will & Emery LLP

(57) ABSTRACT

A circuit device includes an insulating base provided with a resin layer mixed with a fibrous filler, bumps provided in the insulating base and functioning as electrodes for connection, a semiconductor device that is flip-chip mounted, and an underfill filling a gap between the semiconductor device and the insulating base. By allowing the fibrous filler projecting through the top surface of the resin layer to be in contact with the underfill, strength of adhesion between the underfill and the insulating base is improved.

5 Claims, 24 Drawing Sheets

U.S. PATENT DOCUMENTS

| | | | |
|---|---|---|---|
| 6,846,549 B2 * | 1/2005 | Tani et al. | 428/209 |
| 7,514,781 B2 * | 4/2009 | Kawamoto | 257/702 |
| 7,566,834 B2 * | 7/2009 | Shimoto et al. | 174/258 |
| 7,640,660 B2 * | 1/2010 | Abe et al. | 29/847 |
| 7,667,977 B2 * | 2/2010 | Sugaya et al. | 361/766 |
| 7,791,204 B2 * | 9/2010 | Hayashi et al. | 257/773 |
| 7,796,845 B2 * | 9/2010 | Murai et al. | 385/14 |
| 7,916,492 B1 * | 3/2011 | Zhong et al. | 361/760 |
| 7,999,387 B2 * | 8/2011 | Sakamoto et al. | 257/762 |
| 8,008,130 B2 * | 8/2011 | Honda | 438/122 |
| 8,012,561 B2 * | 9/2011 | Harazono et al. | 428/116 |
| 2009/0229869 A1 * | 9/2009 | Harada et al. | 174/258 |
| 2009/0255714 A1 * | 10/2009 | Sohn et al. | 174/250 |

FOREIGN PATENT DOCUMENTS

| | | |
|---|---|---|
| JP | 09-064538 | 3/1997 |
| JP | 2002-076185 | 3/2002 |
| JP | 2002-217506 | 8/2002 |
| JP | 2003-133730 | 5/2003 |
| JP | 2007-027706 | 2/2007 |
| JP | 2007-158193 | 6/2007 |
| JP | 2007-189216 | 7/2007 |

OTHER PUBLICATIONS

International Preliminary Examination Report on Patentability, w/ English translation thereof, issued in International Application No. PCT/JP2008/002186 dated Mar. 4, 2010.

* cited by examiner

CIRCUIT DEVICE, METHOD OF MANUFACTURING THE CIRCUIT DEVICE, DEVICE MOUNTING BOARD AND SEMICONDUCTOR MODULE

CROSS-REFERENCE TO RELATED APPLICATIONS

This application is based upon International Application No. PCT/JP2008/002186, filed Aug. 8, 2008 and claims the benefit of priority from the prior Japanese Patent Application No. 2007-210246, filed Aug. 10, 2007 and Japanese Patent Application No. 2007-254714, filed Sep. 28, 2007, the entire contents of which are incorporated herein by reference.

BACKGROUND OF THE INVENTION

1. Field of the Invention

The present invention relates to circuit devices, methods of manufacturing the device, and mobile devices. In particularly, the invention relates to a circuit device in which strength of adhesion between a substrate forming the device and other members is improved, and to a method of manufacturing the device. The present invention further relates to a mobile device provided with such a circuit device.

2. Description of the Related Art

FIG. 13 shows an exemplary circuit device 161 according to the related art and FIGS. 14A-14E show a method of manufacturing the device of FIG. 13 (see, for example, patent document No. 1).

FIG. 13 is a sectional view of the circuit device 161 disclosed in patent document No. 1. FIGS. 14A-14E are sectional views illustrating the method of manufacturing the circuit device 161.

As shown in FIG. 13, in the circuit device 161 a wiring layer 163 is formed on top of an insulating substrate 162 made of a resin material. A protective layer 164 made of a resin material is formed on top of the insulating substrate 162 so as to also cover the wiring layer 163. A part of the wiring layer 163 is projected through an opening of the protective layer 164 so that bumps 165 and 166 are used as conductive bumps.

A bare chip 167 mounted above the insulating substrate 162. The bare chip 167 is mounted above the insulating substrate 162 such that ends of the conductive bumps 165 and 166 are in contact with pads 168 and 169 of the bare chip 167. The gap between the insulating substrate 162 and the bare chip 167 is filled with a sealing resin 170.

Via holes 171 and 172 are formed on the bottom of the insulating substrate 162 so that a part of the wiring layer 163 is exposed through the via holes 171 and 172. The circuit device 161 is mounted on an external device mounting board via the wiring layer 163 exposed through the via holes 171 and 172.

A description will now be given of a method of manufacturing the circuit device 161 described above with reference to FIGS. 14A-14E.

As shown in FIG. 14A, a template 173 is used as a mold. The template 173 is formed with recesses 174 and 175 where the bumps 165 and 166 (see FIG. 13) are provided. A seed layer 176 that serves as a cathode used in electroplating, which is performed later, is formed on the template 173. Subsequently, a resist film 177 is formed on the seed layer 176. The resist film 177 is selectively removed so as to open an area where the wiring layer 163 (see FIG. 14B) is formed.

As shown in FIG. 14B, the wiring layer 163 is formed by electroplating, using the seed layer 176 as a cathode. In this process, the wiring layer 163 is also formed in the recesses 174 and 175 with a uniform film thickness. Subsequently, the resist film 177 (see FIG. 14A) is removed.

As shown in FIG. 14C, the insulating substrate 162 is formed above the template 173 so as to also cover the wiring layer 163, using, for example, an electrodeposition method. The insulating substrate 162 is formed by using a polyimide resin, which is excellent in flexibility and resistance to flexure. The via holes 171 and 172 having a diameter of about 100 (μm) are formed in the insulating substrate 162 using, for example, $CO_2$ gas laser.

As shown in FIG. 14D, the template 173 (see FIG. 14C) is detached from the insulating substrate 162. Detachment occurs at the interface between the template 173 and the seed layer 176 (see FIG. 14A). Therefore, the seed layer 176 (see FIG. 14A) is subsequently removed by wet etching. Subsequently, the protective layer 164 comprising, for example, epoxy resin is formed on the side of the insulating substrate 162 formed with the wiring layer 163. The protective layer 164 is formed by coating the entirety of the insulating substrate 162 with varnish comprising epoxy resin, using a curtain coating method, and by curing, polymerizing, and hardening the coating. The resin formed on the end of the conductive bumps 165 and 166 is wet-etched by, for example, a water solution of potassium permanganate so as to expose the end of the bumps 165 and 166 through the protective layer 164.

As shown in FIG. 14E, the bare chip 167 is mounted on the conductive bumps 165 and 166 using, for example, a flip chip bonder. The sealing resin 170 disposed between the insulating substrate 162 and the bare chip 167 becomes fluid by heating the entirety of the assembly while the bare chip 167 as mounted is loaded, with the result that the gap between the insulating substrate 162 and the bare chip 167 is filled with the sealing resin 170.

Patent document No. 2 discloses a technology for preventing detachment of a printed board from an insulating layer. More specifically, referring to FIG. 1 and the associated description in patent document No. 2, glass cloth included in the printed board is partly exposed on top of the printed board. An insulating layer is formed on top of the printed board where the glass cloth is exposed. The document recites that such a structure improves the strength of adhesion between the printed board and the insulating layer. [patent document No. 1] Japanese Patent Application Publication No. 2002-76185 (pages 4-6, FIGS. 1-2). [patent document No. 2] Japanese Patent Application Publication No. 9-64538 (FIG. 1 and the associated description).

Referring to FIG. 13 of document No. 1, the technology according to the document has a drawback in that the strength of adhesion between the insulating substrate 162 and the sealing resin 170 is not sufficient. The members may be detached from each other due to temperature variation under certain conditions of use. More specifically, the bare chip 167, which is flip chip mounted, comprises a semiconductor such as silicon and has a coefficient of thermal expansion considerably different from the coefficient of the sealing resin 170 and the insulating substrate 162, which mainly comprises a resin material. Accordingly, when the circuit board device 161 undergoes a heat cycle, large heat stress developed between the sealing resin 170/insulating substrate 162 and the bare chip 167. This might result in the sealing resin 170 being detached from the insulating substrate 162 at the interface therebetween.

It should further be noted that patent document No. 2 merely discloses the structure of the substrate and the method of manufacturing the substrate. As such, the document No. 2 does allow for the problem of thermal stress caused by the heat from a semiconductor device. Thus, it is difficult to simply apply the technology as disclosed in the document to a circuit device in which flip chip mounting is used.

SUMMARY OF THE INVENTION

The present invention has been developed in light of the problem discussed.

The circuit device according to the present invention comprises: a semiconductor device formed with a plurality of pads on one of the major surfaces thereof and flip-chip mounted; an insulating base comprising a first resin layer mixed with a filler; a connecting interface projecting from the first resin layer toward the semiconductor device and connected to the pad of the semiconductor device; and a second resin layer filling a gap between the semiconductor device and the first resin layer, wherein the second resin layer is in contact with the filler exposed through the first resin layer.

The method of manufacturing a circuit device according to the present invention comprises: producing an insulating base that comprises a first resin layer mixed with a filler, a first major surface, and a second major surface opposite to the first major surface, and configured such that a conductive member is embedded at a location corresponding to a pad of semiconductor device to be mounted; etching the insulating base from the first major surface such that etchants with different etching rates are used to etch the first resin layer and the filler, causing the conductive member to project outside, turning it into a bump, and exposing the filler outside through the first resin layer; flip-chip bonding the semiconductor device so as to connect the pad of the semiconductor device to the bump electrically, filling a gap between the first resin layer and the semiconductor device with a second insulating layer, and causing the filler projecting through the first resin layer to be in contact with the second resin layer.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

First Embodiment

Figure 1A:
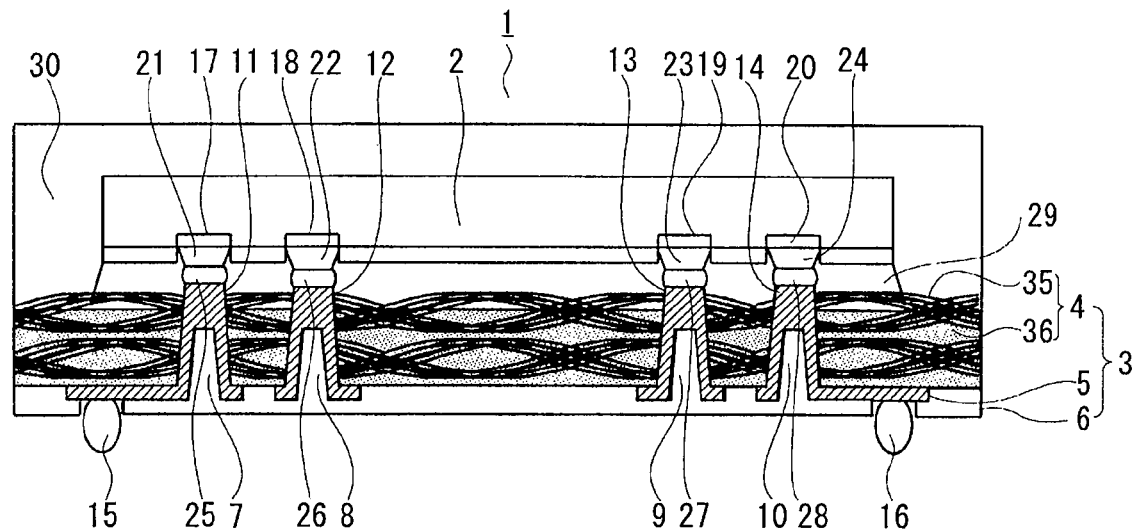
FIGS. 1A and 1B are sectional views showing the circuit device according to the first embodiment of the present invention.
Figure 1B:
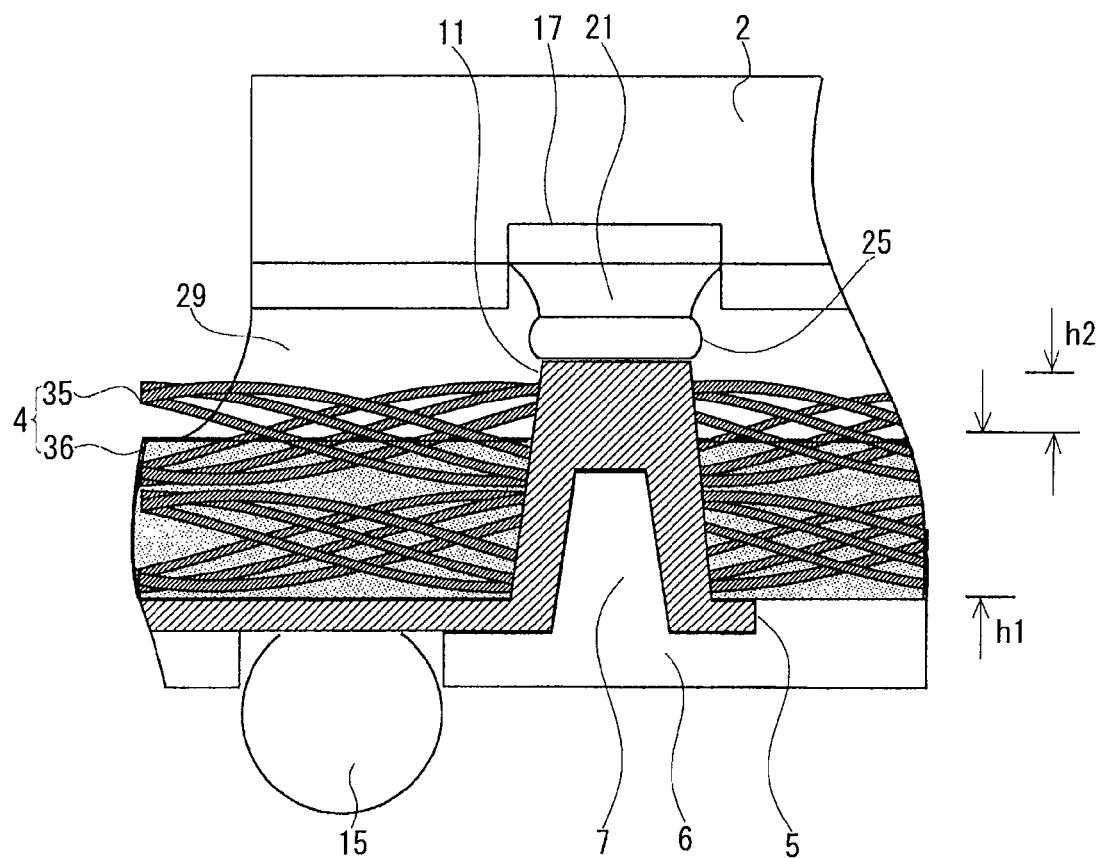

A description will now be given, with reference to FIGS. 1A-5, of a circuit device according to an embodiment and a method of manufacturing the device. FIGS. 1A and 1B show the structure of a circuit device 1 according to the embodiment. FIGS. 2A-5 show the method of manufacturing the circuit device 1.

A description will be given of the structure of the circuit device 1 with reference to FIGS. 1A and 1B.

As shown in FIGS. 1A and 1B, the circuit device 1 is a resin-sealed chip size package (CSP), the outer dimension of which is slightly larger than a semiconductor device 2 built inside. In appearance, the circuit device 1 formed as a rectangular solid or a cube. While the description of the embodiment highlights a circuit device of chip size package type but the description is non-limiting. For example, the device may be a wafer level package (WLP) in which the outer dimension of the circuit device is substantially identical to the size of the semiconductor device mounted.

A device mounting board 3 mainly comprises an insulating base 4, a wiring layer 5 formed on the insulating base 4, and a covering layer 6 covering the bottom of the insulating base 4. The insulating base 4 comprises a resin layer 36 (first resin layer) made of a resin material such as epoxy resin, and a fibrous filler 35 (filler) mixed in the resin layer 36. Only the fibrous filler 35 may be mixed in the resin layer 36, a particle filler may be mixed, or both the fibrous filler and the particle filler may be mixed in the resin layer 36. The covering layer 6 may or may not be provided on the bottom of the insulating base 4.

The insulating base 4 is, for example, a glass epoxy produced by impregnating the fibrous filler 35 such as glass cloth with epoxy resin, and is an interposer mainly of comprising resin material. The semiconductor device 2 is mounted on the top of the insulating base 4, and the wiring layer 5 is formed on the bottom thereof. The insulating base 4 also has the function of mechanically supporting the semiconductor device 2 in the manufacturing process. The ratio of the fibrous filler 35 contained in the entirety of the insulating base 4 is 15 wt %-50 wt %.

A material having a smaller coefficient of thermal expansion than the resin material forming the resin layer 36 is used to form the fibrous filler 35. More specifically, the fibrous filler 35 comprises glass, which is characterized by a small coefficient of thermal expansion. A glass cloth having a diameter of 2 µm-10 µm (typically, 5 µm) is employed. The coefficient of thermal expansion of epoxy resin, which forms the resin layer 36, is about $62 \times 10^{-6}$/° C. The coefficient of thermal expansion of glass cloth, which may be employed to form the fibrous filler 35, is about $8 \times 10^{-6}$/° C. By employing a material having a relatively small coefficient of thermal expansion as the material to form the fibrous filler 35, it is ensured that the insulating base 4, which comprises the fibrous filler 35 and the resin layer 36, has a small coefficient of thermal expansion approximating the coefficient ($2 \times 10^{-6}$/° C.) of the semiconductor 2 built inside the circuit device 1. With this, thermal stress developed between the insulating base 4 and the semiconductor device 2 when the circuit device 1 undergoes temperature change is reduced so that reliability of connection at their interface is improved.

In addition to the above, a material with more excellent thermal conductivity than the resin layer 36 is employed to form the fibrous filler 35 in order to efficiently release the heat generated from the semiconductor device 2 to an environment via the insulating base 4. In this regard, it should be noted that the thermal conductivity of glass cloth, which may form the fibrous filler 35 by way of example, is 0.55 (W/m*K), and the thermal conductivity of epoxy resin, which may form the resin layer 36 by way of example, is 0.19 (W/m*K).

Further, a material with more excellent etching properties than the resin layer 36 is suitably used to form the fibrous filler 35. In other words, a material exhibiting a lower etching rate with respect to the etchant used in the step of etching the insulating base 4 than the resin layer 36 is favorable as the fibrous filler 35. By designing the filler 35 and the layer 36 as such, the insulating base 4 is etched downward such that the resin layer 36 is etched to a desired thickness, while the fibrous filler 35 remains unetched and is exposed through the resin layer 36. For example, glass cloth is characterized by a small etching rate and so is suitably used as a material for the fibrous filler 35 in this respect, too.

A fiber comprising aramid resin and having properties (coefficient of thermal expansion, thermal conductivity, etching rate) different from the resin layer 36 (e.g., epoxy resin) may be used to form the fibrous filler 36 in an unwoven state. It will be noted that the coefficient of thermal expansion of aramid resin is $0.1 \times 10^{-6}$/° C.-$10 \times 10^{-6}$/° C. typically, $0.35 \times 10^{-6}$/° C. The thermal conductivity of aramid resin is 0.1 (W/m*K)-0.2 (W/m*K) (typically, 0.15 (W/m*K)). Further, the thickness (diameter) of fibrous aramid resin is 2 µm-10 µm (typically, 5 µm).

By employing fibrous aramid resin as the fibrous filler 35, the following advantages will be available. First, the coefficient of thermal expansion of aramid resin is small so that mismatching of coefficients of thermal expansion between the semiconductor device and the insulating base 4 is efficiently reduced. Further, by employing aramid resin in an unwoven state to form the fibrous filler 35, the fibrous filler 35 comprising the aramid resin is collected on top of the base in the step of etching the major surface of the insulating base 4. Therefore, etching is completed in a self-aligned manner. This improves the uniformness (flatness) of the top surface of the insulating base 4 etched. Details will be given lager in the description of the manufacturing process.

In this embodiment, the fibrous filler 35 is partly exposed through the top surface of the resin layer 36 forming the insulating base 4. The fibrous filler 35 thus exposed is in contact with an underfill 29 described later. The fibrous fiber 35 is also in contact with a sealing resin 30 covering the semiconductor device 2. To describe how the fibrous filler 35 is exposed through the resin layer 36 in detail, a large number of fibers project above the top surface of the resin layer 36. Therefore, the underfill 29 covering the insulating base 4 from above is also in contact with and covers the fibrous filler 35 exposed. Further, the surface of those portions of the fibrous filler 35 exposed may be roughened in the etching process described later or partly severed. Details will be given later.

The wiring layer 5 is formed by, for example, selectively etching a Cu plating layer formed by, for example, electrolyte plating. The film thickness of the wiring layer 5 may be about 20-50 (µm). The wiring layer 5 is formed by patterning the bottom of the insulating base 4. The wiring layer 5 projects through the surface of the insulating base 4 via through holes 7, 8, 9, and 10 formed in the insulating base 4.

Bumps 11, 12, 13, and 14 of the wiring layer 5 project above the through holes 7, 8, 9, and 10 and are used as connecting interfaces. The bumps 11, 12, 13, and 14 of the wiring layer 5 project above the surface of the insulating base 4 (resin layer 36) by about 10-30 (µm). The height of projection is designed as desired depending on the usage. Further, the top surface of the insulating base 4 is not patterned by the wiring layer 5. Only the bumps 11, 12, 13, and 14 are formed.

The covering layer 6 covers the bottom of the insulating base 4. Those parts of the covering layer 6 where external electrodes 15 and 16 are formed are provided with openings. The covering layer 6 comprises a thermosetting resin such as epoxy resin or a thermoplastic resin such as polyethylene. The thickness of the covering layer 6 covering the top surface of the wiring layer 5 is about 20-100 (µm). The covering layer 6 may be referred to as a solder resist or a photo solder resist (PSR).

The external electrodes 15 and 16 may comprise a conductive material such as solder and are formed as a ball grid array (BGA) provided on the bottom of the insulating base 4. The external electrodes 15 and 16 are electrically connected to the semiconductor device 2 built inside the circuit device 1 via the wiring layer 5. Since the circuit device 1 may be a system in package (SIP), the external electrodes 15 and 16 may be located to form a ring at the periphery of the insulating base 4 or randomly positioned.

The semiconductor device 2 (circuit device) is connected above the insulating base 4 via the bumps 11, 12, 13, and 14 of the wiring layer 5. More specifically, bump electrodes 21, 22, 23, and 24 made of, for example, Au, are formed on pads 17, 18, 19, and 20 of the semiconductor device 2. The bump electrodes 21, 22, 23, and 24 of the semiconductor device 2 are mounted on the bumps 11, 12, 13, and 14 of the wiring layer 5 via conductive members 25, 26, 27, and 28, respectively, using a flip-chip bonding technology. Wax or conductive paste is used to form the conductive members 25, 26, 27, and 28.

The description above concerns a case where the bump electrodes 21, 22, 23, and 24 are formed on the semiconductor device 2 but the structure is not limited to the one described. For example, the pads 17, 18, 19, and 20 of the semiconductor 2 may be directly electrically connected to the bumps 11, 12, 13, and 14 of the wiring layer 5 via the conductive members 25, 26, 27, and 28. Alternatively, a liquid resin or sheet resin may be provided on the insulating base 4 on which the bumps 11, 12, 13, and 14 are provided. A pressure may be applied when the semiconductor device 2 is mounted so that the device 2 is resin bonded by hardening the resin.

The semiconductor device 2 is used as a circuit element built in the circuit device 1. Alternatively, other circuit devices may be used. More specifically, an active device like an IC, an LSI, a discrete transistor, or a diode may be used as a circuit element. Still alternatively, a passive device like a chip resistor, a chip capacitor, or a sensor may be used as a circuit element. Yet alternatively, a system where passive devices and active devices are internally connected may be built inside the circuit device 1. In this case, more bumps of the wiring layer 5 are provided to project through the surface of the insulating base 4. Passive devices such as a chip resistor are provided adjacent to the semiconductor device 2 shown in FIG. 1A.

The device mounting board 3 is applicable to a module that simply carries a circuit device or an totally encapsulated circuit device. Semiconductor chips or passive elements may be mounted on the board or built in the circuit device. These circuit devices may be provided in a three-dimensional or two-dimensional arrangement. That the devices are arranged three-dimensionally means that multiple semiconductor chips may be stacked. Multiple semiconductor devices may be provided in a two-dimensional arrangement. In any case, multiple circuit devices are provided so as to build a system.

The underfill 29 (second insulating layer) is provided to fill the gap between the semiconductor device 2 and the insulating base 4. The underfill 29 is comprises, for example, epoxy resin. The underfill 29 is also used as a member reinforcing bump connections in the face of thermal stress developed due to a difference in the coefficient of thermal expansion between the semiconductor device 2 and the insulating base 4. The coefficient of thermal expansion and viscosity of the underfill 29 are adjusted by the amount of filler mixed in the epoxy resin used as the underfill 29. The amount of filler contained in the underfill 29 is generally smaller than that in the insulating base 4.

The sealing resin 30 comprises a thermosetting resin formed in a transfer molding process or a thermoplastic resin formed in an injection molding process. The sealing resin 30 is also mixed with a filler comprising, for example, alumina particles ($Al_2O_3$) in order to reduce thermal resistance. The sealing resin 30 is formed to cover the top surface of the semiconductor device 2 and the insulating base 4.

As shown in FIG. 1B, the through hole 7 connecting the top and bottom of the insulating base 4 is formed in the base 4. The wiring layer 5 is formed by patterning the bottom of the insulating base 4 and is guided through the inner surface of the through hole 7 so as to project through the top surface of the insulating base 4. Details will be given later in describing the method of manufacturing the circuit device. The bump 11 is formed by etching the insulating base 4 from the surface thereof. The thickness h2 of the area in the wiring layer 5 used as a bump electrode is embedded in the insulating base 4. Accordingly, the thickness of the device mounting board 3 is reduced by the thickness h2 so that the thickness of the circuit device 1 is reduced accordingly.

Meanwhile, the height h2 of the bump projecting above the surface of the insulating base 4 is set as desired depending on the usage of the bump electrode by adjusting the amount of etching the insulating base 4. By increasing the height h2 of the bump, the distance separating the insulating base 4 from the semiconductor device 2 is increased so that damage to the conductive material 25 caused by thermal stress developed due to a difference in the coefficient of thermal expansion between the base 4 and the device 2 is reduced and the reliability of connection is improved accordingly. By increasing the height h2 of the bump, the bump electrode 21 of the semiconductor device 2 may be omitted or the height of the bump electrode 21 may be reduced.

In this embodiment, the fibrous filler 35 included in the insulating base 4 is partly exposed outside. The fibrous filler 35 thus exposed is in contact with the underfill 29. More specifically, the insulating base 4 is produced by impregnating the fibrous filler 35 comprising glass cloth with the resin layer 36 comprising epoxy resin. In this embodiment, the fibrous filler 35 is exposed through the top surface of the resin layer 36 using an etching process described later. This causes the fibrous filler 35 projecting from the top surface of the resin layer 36 to be in contact with the underfill 29. Accordingly, the fibrous filler 35 projecting from the top surface of the resin layer 36 operates to bond the resin layer 36 with the underfill 29, thereby increasing the strength of adhesion between the layer 36 and the underfill 29. In other words, the fibrous filler 35 projecting above the resin layer 36 is impregnated with the underfill 29. The term "contact" encompasses merely contact of the underfill 29 with the fibrous filler 35, the reaching of the resin layer 36 through the fibers forming the fibrous filler 35, the reaching of the underfill 29 between the fibers forming the fibrous filler 35, or the fibers forming the fibrous filler 35 being wrapped by the underfill 29.

Further, by allowing the fibrous filler 35 to project from the resin layer 36, the coefficient of thermal expansion of the underfill 29 is reduced. More specifically, the coefficient of thermal expansion of the underfill 29 is generally large because the underfill 29 cannot be mixed with a large amount of filler to secure the fluidity during coating. For this reason, detachment might occur at the interface between the underfill 29 and other members (the semiconductor device 2 or the insulating base 4) due to a difference in the coefficient of thermal expansion between the underfill 29 and the other members. This is avoided according to this embodiment by incorporating the fibrous filler 35 projecting above the insulating base 4 in the underfill 29. This allows the fibrous filler 35 projecting above to operate as a filler included in the underfill 29. As a result, the coefficient of thermal expansion of the underfill 29 is substantively reduced. By reducing the coefficient of thermal expansion of the underfill 29, the difference in the coefficient of thermal expansion between the underfill 29 and the semiconductor device 2 is reduced. Thermal stress developed at the area of contact between the two is reduced.

Further, since the fibrous filler 35, which is excellent in thermal conductivity, is included in the underfill 29 in the above structure, the substantive thermal conductivity of the underfill 29 as a whole is improved. Therefore, the heat generated by the semiconductor device 2 in operation is properly released outside via the underfill 29.

The surface of the fibrous filler 35 as exposed may be roughened by an etching process described later or a part of the filler 35 may be ruptured. By placing the fibrous filler 35 in such a state, it is ensured that the adhesion between the fibrous filler 35 and the underfill 29 is favorable.

A description will now be given, with reference to FIGS. 2A-5 of the method of manufacturing the circuit device shown in FIG. 1. Those constituting members that are identical to the members shown in FIG. 1A are designated by the same reference numbers.

First Step: See FIG. 2

In this step, a conductive foil (Cu foil) is formed on both major surfaces of the insulating base 4 and a conductive member is formed through the insulating base 4.

Figure 2A:
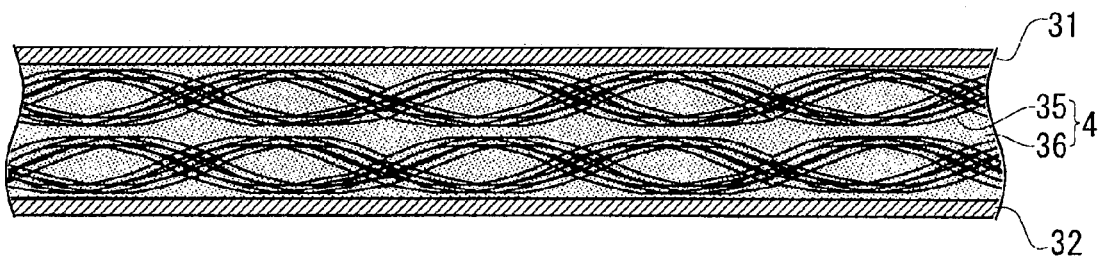
FIGS. 2A-2C are sectional views showing the method of manufacturing the circuit device according to the first embodiment of the present invention.

Referring to FIG. 2A, Cu foils 31 and 32 are pasted as a conductive member onto the entirety of the top and bottom surfaces of the insulating base 4, using a plating method, a vapor deposition method, a sputtering method, or a metal rolling method. An Al foil, Fe foil, or Fe—Ni foil may be used as a conductive member. The insulating base 4 is produced by impregnating the fibrous filler 35 comprising glass cloth or fibrous aramid resin with the resin layer 36 (comprising epoxy resin). The insulating base 4 also has the function of mechanically supporting the semiconductor device 2 (see FIG. 1A) in the manufacturing process.

The Cu foil 31 of the insulating base 4 is detached in the subsequent step of forming a wiring layer and is only required to fulfill its role as a supporting member for supporting the insulating base 4. The foil 31 may be omitted.

Figure 2B:
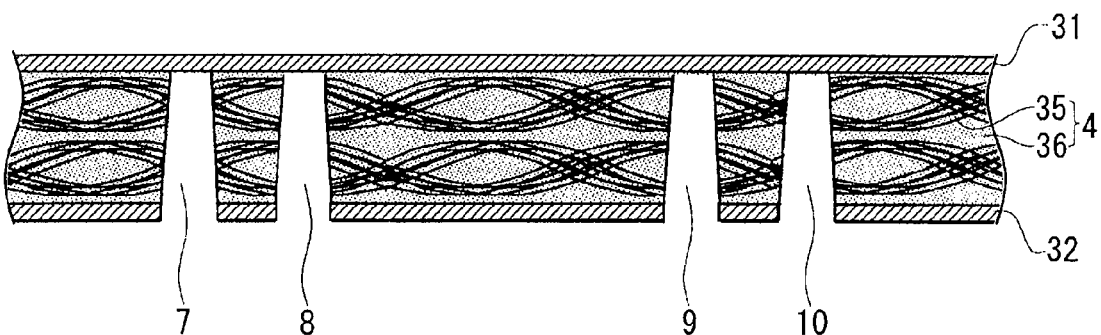

Referring to FIG. 2B, the through holes 7, 8, 9, and 10 are formed from the bottom of the insulating base 4. More specifically, a publicly known photolithographic technology is used so that the areas of the Cu foil 32 where the through holes 7, 8, 9, and 10 are formed are wet-etched by an etchant such as ferric chloride or copper chloride. The Cu foil 32 that remains is used as a mask. $CO_2$ gas laser is used to remove the insulating base 4 and expose the Cu foil 31 at the bottom of the through holes 7, 8, 9, and 10. The remnant of the base 4 remaining at the bottom of the through holes 7, 8, 9, and 10 after vaporizing the insulating base 4 using $CO_2$ gas laser will be removed by wet-etching using an etchant such as sodium permanganate or ammonium persulfate.

Figure 2C:
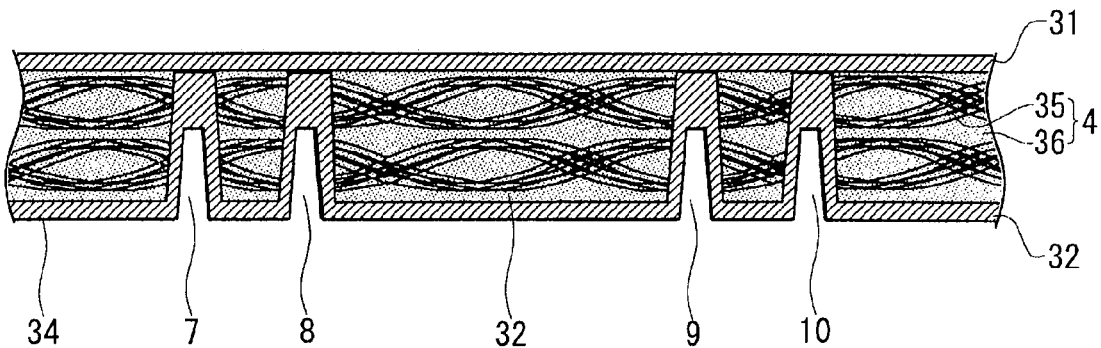

Referring to FIG. 2C, a conductive member is formed inside the through holes 7, 8, 9, and 10. More specifically, an electroless plating film having a thickness of about 1 ($\mu$m) is formed on the interior wall of the through holes 7, 8, 9, and 10 using an electroless plating method. The electroless plating film is also attached on the surface of the Cu foil 31 and the Cu foil 32. Subsequently, an electroplating step is performed using the Cu foil 31 and the Cu foil 32 as electrodes so as to form an electroplating film having a thickness of about 5 ($\mu$m)-10 ($\mu$m). Through this step, an electroplating film is formed is also formed on the top surface of the electroless plating film covering the interior wall of the through holes 7, 8, 9, and 10.

The conductive member implemented by the plating films formed inside the through holes 7, 8, 9, and 10 are used as electrodes connected to the pads of the semiconductor device.

The first step described above may be modified. In other words, the above step may be performed without using the Cu foil 31 covering the top surface of the insulating base 4. Further, the conductive member formed inside the through holes 7, etc. may not be a plating film of the same material as the Cu foil 32. A conductive material (e.g., aluminum) different from the material of the Cu foil 32 may be used. Still alternatively, the insulating base 4 without the Cu foil 31 and the Cu foil 32 may be prepared so that conductive member may be formed on both major surfaces of the insulating base 4 and inside the through holes by electroless plating and electroplating.

Second Step: See FIGS. 3A-3C

In this step, the insulating base 4 is etched from the top so as to project the conductive member formed inside the through holes 7, 8, 9, and 10 and to expose the fibrous filler 35 contained in the insulating base 4.

Figure 3A:
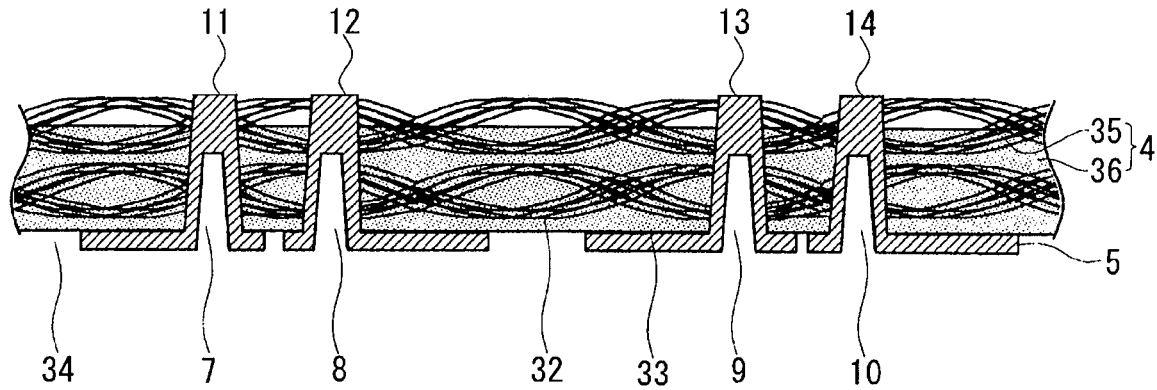
FIGS. 3A-3C are sectional views showing the method of manufacturing the circuit device according to the first embodiment of the present invention.

Referring to FIG. 3A, a publicly known photolithographic technology is used to form a photoresist (not shown) on top of the Cu foil 32 (see FIG. 2C) used as the wiring layer 5. More specifically, the Cu foil 32 (see FIG. 2C) is selectively wet-etched by an etchant such as ferric chloride or copper chloride so as to form the wiring layer 5.

The Cu foil 31 (see FIG. 2C) attached to the surface of the insulating base 4 is detached. To remove the Cu foil entirely, chemical etching using ferric chloride or copper chloride may be used in the detaching step. By detaching the Cu foil 31 from the surface of the insulating base 4 entirely, the wiring layer 5 formed in the through holes 7, 8, 9, and 10 is partly exposed.

Referring to FIG. 3A, the insulating base 4 is etched from its surface so as to project the wiring layer 5 partly filling the through holes 7, etc. through the surface of the insulating base 4. In this process, the fibrous filler 35 included in the insulating base 4 is projected above.

The insulating base 4 may be dry etched or wet etched. In the case of dry etching, the insulating base 4 is etched in an atmosphere containing a mixture of oxygen and nitrogen, and using a plasma output of 50-150 (W). The duration of the step is 3-30 (min). In the case of wet etching, the insulating base 4 is etched using a water solution mainly containing sodium permanganate and sodium hydroxide as an etchant. The temperature of processing is 70-85 (° C.), and the duration of the step is 5-30 (min). As a result of the etching step, the bumps 11, 12, 13, and 14 are formed on the surface of the insulating base 4. The height of the bumps 11, etc. (the distance between the top surface of the resin layer 36 and the apex of the bumps 11, etc.) is, for example, 10-30 ($\mu$m).

Figure 3B:
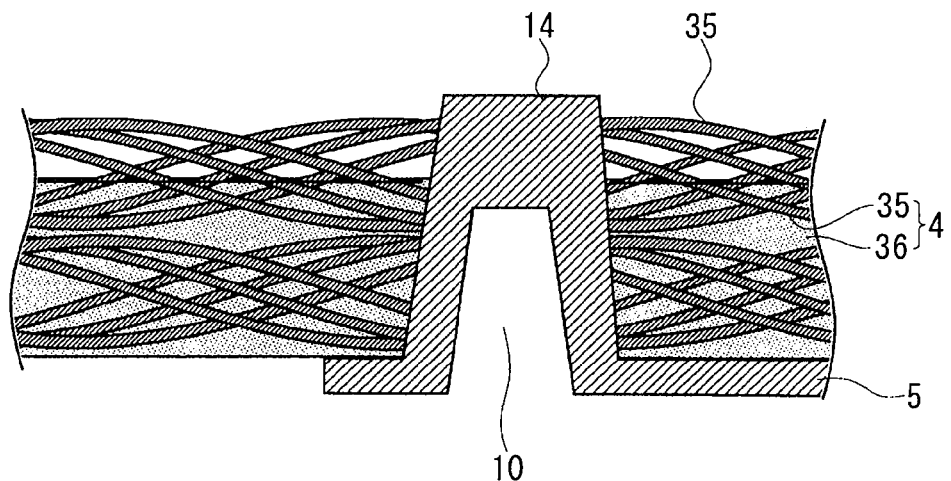

FIG. 3B is a magnified view of a part of FIG. 3A. Referring to the figure, the conductive member embedded in the through hole 10 projects above so as to form the bump 14. A part of the fibrous filler 35 included in the insulating base 4 remains unetched and projects above. This is due to a difference in the etching rate with respect to the etchant between the resin layer 36 comprising epoxy resin and the fibrous filler 35 comprising glass epoxy. In other words, the resin layer 36 is immediately corroded in the etching step as described above but the fibrous filler 35 substantially remains uncorroded. As a result, only the resin layer 36 is etched and the fibrous filler 35 remains.

When, as a result of the above-described step, the surface of the fibrous filler 35 comprising glass cloth or the like is slightly corroded and roughened, the strength of adhesion between the surface of the fibrous filler 35 and the underfill is improved.

A part of the fibrous filler 35 as exposed as a result of the above step may be ruptured. The fibrous filler 35 in this state will have a low density. Consequently, this will advantageously improve the strength of adhesion between the underfill 29 and the fibrous filler 35 and also facilitate the filling of the gap with the underfill 29. These advantages will be enhanced by introducing an additional step of roughening or rupturing the fibrous filler 35 exposed from the insulating layer 36 using a mechanical process like brushing.

Figure 3C:
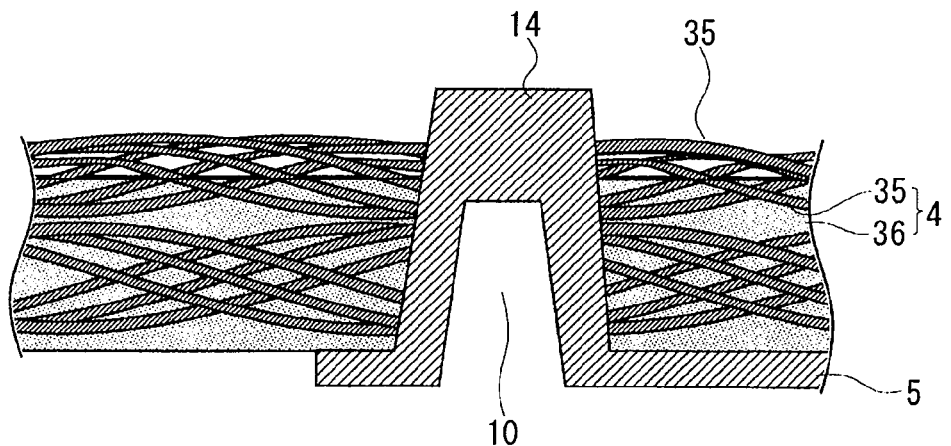

Referring to FIG. 3C, the fibrous filler 35 exposed outside may function as a layer for stopping the etching process at a predetermined thickness. More specifically, as the etching process described above proceeds, the resin layer 36 will be gradually corroded from the top layer so that the fibrous filler 35 is exposed outside. As a large volume of the fibrous filler 35 is exposed outside, the fibrous filler 35 will be collected on the top surface of the resin layer 36 due to the gravitational force, increasing the difficulty of contact between the etchant and the top surface of the resin layer 36 and terminating the etching step. In this way, the thickness of the resin layer 36 etched is controlled without exercising special control. This can also ensure that the thickness of the resin layer 36 as etched is uniform. These advantages will be available when glass cloth is employed to form the fibrous filler 35, but the advantages will be pronounced when a fiber comprising aramid is used to form the fibrous filler 35 in an unwoven state.

Further, as shown in FIG. 1B, the bumps 11, 12, 13, and 14 of the wiring layer 5 are used as bump electrodes so that the height of the bumps 11, 12, 13, and 14 are designed as desired to meet the usage by changing the duration of processing. In other words, according to the embodiment, the height of the bumps 11, 12, 13, and 14 can be changed easily by changing the duration of etching and without changing the manufacturing apparatus (including a die). Therefore, the manufacturing method is simplified and the manufacturing cost is reduced.

Third Step: See FIGS. 4A, 4B and 5

In this step, the semiconductor device 2 is flip-chip mounted, and the gap between the semiconductor device 2 and the insulating base 4 is filled with the underfill 29. Further, the sealing resin 30 is formed so as to cover the semiconductor device 2.

Figure 4A:
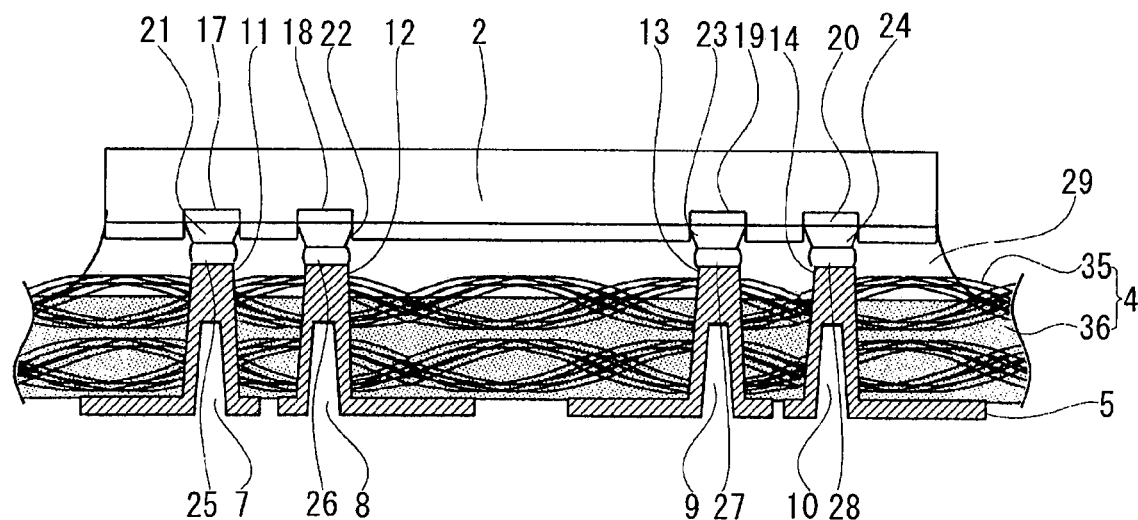
FIGS. 4A and 4B are sectional views showing the method of manufacturing the circuit device according to the first embodiment of the present invention.
Figure 4B:
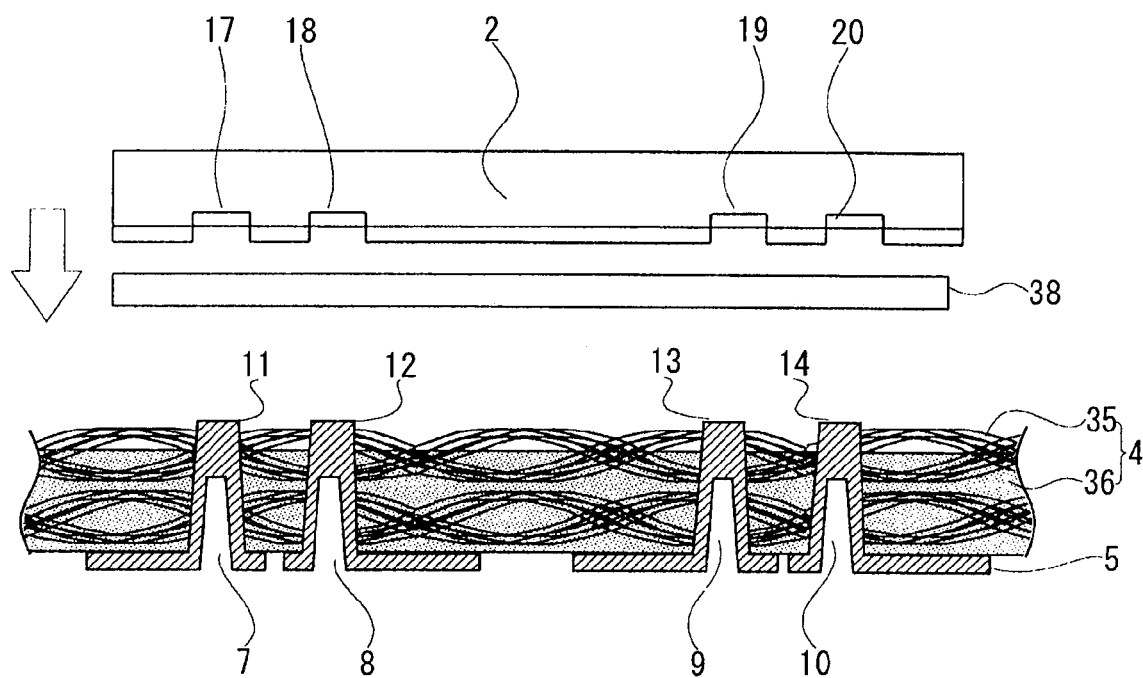

Referring to FIGS. 4A and 4B, the semiconductor device 2 is flip-chip mounted, and the gap below the semiconductor device 2 is filled with the underfill 29. Two methods are conceivable to implement the step, i.e. the method of filling the gap with a liquid underfill and the method of using a resin sheet. The method of using a liquid underfill will be described with reference to FIG. 4A. The method of using a resin sheet 38 will be described with reference to FIG. 4B.

Referring to FIG. 4A, the semiconductor device 2 is mounted on the bumps 11, 12, 13, and 14 used as bump electrodes. For example, the bumps 11, 12, 13, and 14 are coated with the conductive members 25, 26, 27, and 28 made of, for example, wax, using screen printing. The flip-chip bonding technology is used to mount the semiconductor device 2 on the insulating base 4 such that the bump electrodes 21, 22, 23, and 24 of the device 2 are mounted in alignment with the bumps 11, 12, 13, and 14, followed by the reflow of the bumps.

Subsequently, the gap between the semiconductor device 2 and the insulating base 4 is filled with the underfill 29. For example, the underfill 29 may comprise epoxy resin. The liquid underfill 29 is injected from one side or two sides of the semiconductor device 2 using a capillary method. The underfill 29 is then heated and hardened. The viscosity of the underfill 29 is adjusted by controlling the amount of filler mixed in the underfill 29.

In this process, the fibrous filler 35 projects above from the top surface of the insulating base 4. Therefore, as a result of filling the gap between the semiconductor device 2 and the insulating base 4 with the liquid underfill 29, the underfill 29 is bonded to the fibrous filler 35 as exposed. Therefore, the insulating base 4 and the underfill 29 are not only bonded at the interface thereof but are also bonded via the fibrous filler 35 exposed from the resin layer 36. Accordingly, the adhesion between the filler 35 and the underfill 29 is significantly strengthened.

In a method shown in FIG. 4B, the resin sheet 38 in a semi-hardened state, for example, is interposed between the insulating base 4 and the semiconductor 2. The semiconductor device 2 is pressed against the insulating base 4 from above. In this way, the bumps 11, 12, 13, and 14 of the insulating base 4 penetrate the resin sheet 38 and are pressed against the bottom of the pads 17, 18, 19, and 20 of the semiconductor device 2. Further, the resin sheet 38 is heated and hardened. The method as shown also helps improve the strength of adhesion between the underfill, which is embodied by the resin sheet 38, and the resin layer 36 because the fibrous filler 35 projecting outside from the top surface of the insulating base 4 meshes with the resin sheet 38.

Figure 5:
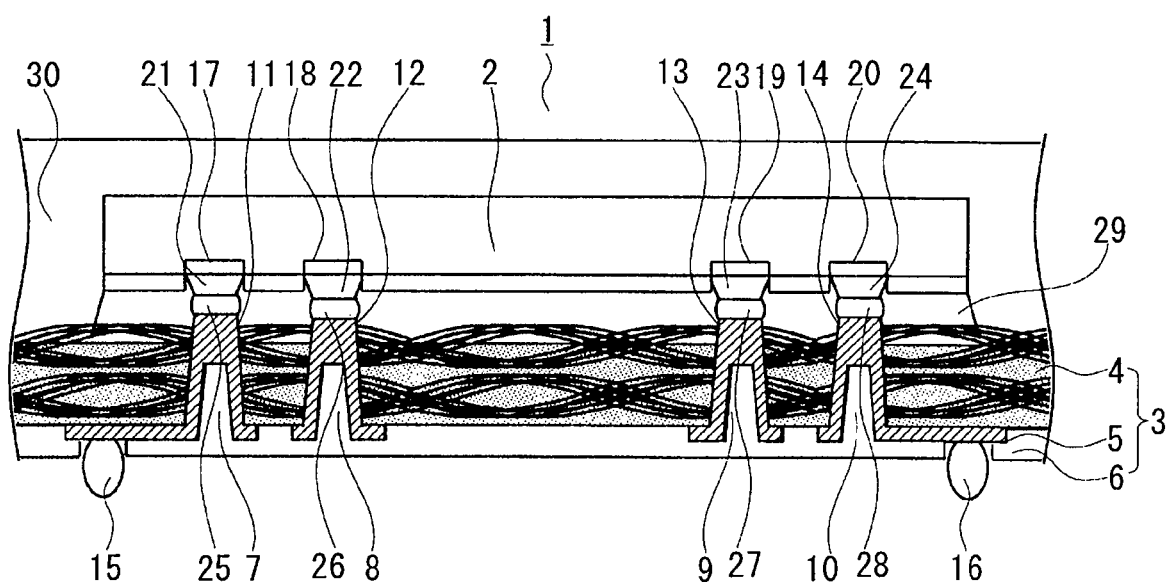
FIG. 5 is a sectional view showing the method of manufacturing the circuit device according to the first embodiment of the present invention.

Referring to FIG. 5, the sealing resin 30 is formed so as to cover the top surface of the semiconductor device 2 and the insulating base 4. The sealing resin 30 may be formed in a transfer molding process using a thermosetting resin or in an injection molding process using a thermoplastic resin.

Subsequently, the covering layer 6 is formed so as to cover the wiring layer 5 provided by patterning the bottom of the insulating base 4. The covering layer 6 comprises a thermosetting resin such as epoxy resin or a thermoplastic resin such as polyethylene. Those parts of the covering layer 6 where the external electrodes 15 and 16 are formed are provided with openings. The openings are used to form the external electrodes 15 and 16 as, for example, solder balls.

When the step is completed, the device mounting board 3 and the insulating resin 30 are cut at predetermined positions so as to obtain individual semiconductor devices. When the semiconductor device 2 is used in the state of a wafer, the wafer, the sealing resin 30, and the device mounting board 3 are cut in a single step at the predetermined positions to isolate individual circuit devices.

Second Embodiment

Figure 6A:
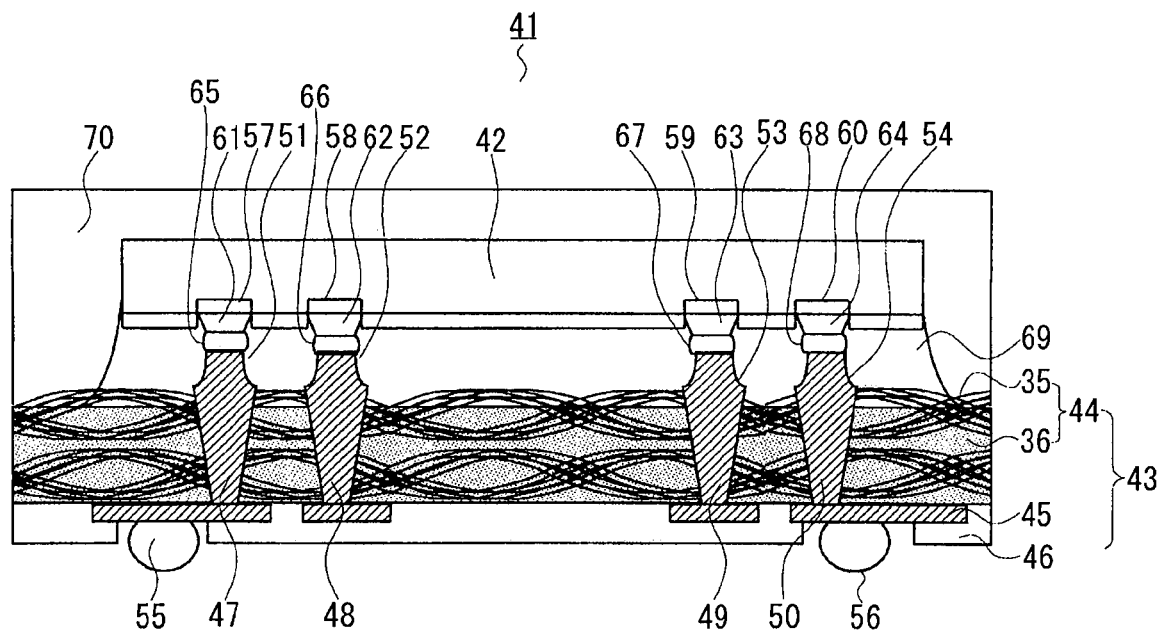
FIGS. 6A and 6B are sectional views showing the circuit device according to the second embodiment of the present invention.
Figure 6B:
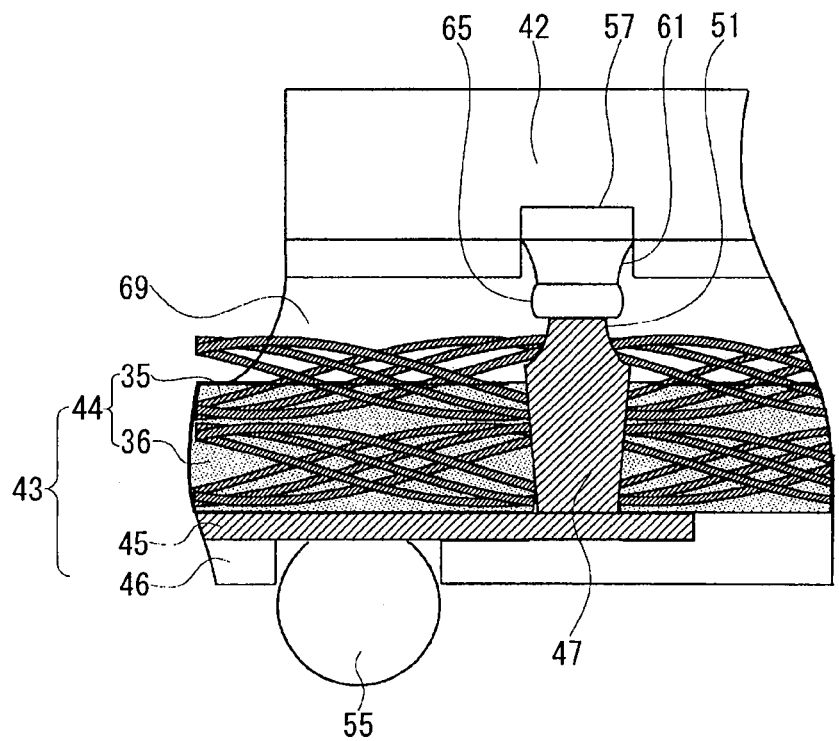

A description will now be given, with reference to FIGS. 6A-8B, of the circuit device and the manufacturing method according to the second embodiment. FIGS. 6A and 6B show the structure of a circuit device 41 according to the second embodiment. FIGS. 7A-8B are sectional views showing the method of manufacturing the circuit device 41. The structure of the circuit device 41 according to the second embodiment is similar to the circuit device 1 described in the first embodiment. Therefore, a detailed description of those components identically named in the first embodiment may be omitted. Characteristically, the circuit device 41 according to the second embodiment is configured such that the connecting interface with the pad of a semiconductor device 42 is implemented by a conductive member embedded in a through hole 47, etc.

First, a description will be given of the structure of the circuit device with reference to FIGS. 6A and 6B.

A device mounting board 43 mainly comprises an insulating base 44, a wiring layer 45 formed on the insulating base 44, and a covering layer 46 covering the bottom of the insulating base 44. The covering layer 46 may or may not be provided on the bottom of the insulating base 44.

The insulating base 44 is, for example, a glass epoxy produced by impregnating the fibrous filler 35 such as glass fiber with an epoxy resin layer 36, and is an interposer mainly comprising a resin material. The semiconductor device 42 is mounted on the top of the insulating base 44, and the wiring layer 45 is formed on the bottom thereof. The insulating base 44 also has the function of mechanically supporting the semiconductor device 42 in the manufacturing process. The fibrous filler 35 included in the insulating base 44 projects from the top surface of the resin layer 36 of the insulating base 44 to be in contact with an underfill 69.

The wiring layer 45 is formed by, for example, selectively etching a Cu plating layer formed by, for example, electrolyte plating. The wiring layer 45 projects through the surface of the insulating base 44 via through holes 47, 48, 49, and 50 formed in the insulating base 44. Bumps 51, 52, 53, and 54 of the wiring layer 45 project above the through holes 47, 48, 49, and 50 and are used as bump electrodes. The bumps 51, 52, 53, and 54 of the wiring layer 45 project above the surface of the insulating base 44 by about 10-30 (μm). The height of projection is optionally designed depending on the usage. Further, the top surface of the insulating base 44 is not patterned by the wiring layer 45. Only the bumps 51, 52, 53, and 54 are formed.

The covering layer 46 covers the bottom of the insulating base 44. Those parts of the covering layer 46 where external electrodes 55 and 56 are formed are provided with openings.

The external electrodes 55 and 56 may comprise a conductive material such as solder and are formed as a ball grid array (BGA) provided on the bottom of the insulating base 44.

The semiconductor device 42 is connected above the insulating base 44 via the bumps 51, 52, 53, and 54 of the wiring layer 45. More specifically, bump electrodes 61, 62, 63, and 64 made of, for example, Au, are formed on pads 57, 58, 59, and 60 of the semiconductor device 42. The bump electrodes 61, 62, 63, and 64 of the semiconductor device 42 are mounted on the bumps 51, 52, 53, and 54 of the wiring layer 45 via conductive members 65, 66, 67, and 68, respectively, using a flip-chip bonding technology. Wax or conductive paste is used to form the conductive members 65, 66, 67, and 68.

The underfill 69 is provided to fill the gap between the semiconductor device 42 and the insulating base 44. The underfill 69 is strongly adhered to the insulating base 44 by being in contact with the fibrous filler 35 exposed through the top surface of the resin layer 36.

A sealing resin 70 may be formed in a transfer molding process using a thermosetting resin or in an injection molding process using a thermoplastic resin. The sealing resin 70 is formed to cover the top surface of the semiconductor device 42 and the insulating base 44.

As shown in FIG. 6B, the through hole 47 connecting the top and bottom of the insulating base 44 is formed in the base 44. The wiring layer 45 is formed by patterning the bottom of the insulating base 44 and is embedded in the through hole 47 so as to project through the surface of the insulating base 44. Details will be given later in describing the method of manufacturing the circuit device. The bump 51 is formed by etching the insulating base 44 from the surface thereof.

A description will now be given, with reference to FIGS. 7A-8B of the method of manufacturing the circuit device 41 having the above-described structure. Those constituting members that are identical to the members of the above-described circuit device are designated by the same reference numbers.

First Step: See FIGS. 7A and 7B

In this step, a conductive member is formed to extend through the insulating base 44, creating a bump, and the wiring layer 45 is provided on the bottom of the insulating base 44.

The insulating base 44 is prepared, and Cu foils 71 and 72 are pasted as a conductive member onto the entirety of the top and bottom surfaces of the insulating base 44, using a plating method, a vapor deposition method, a sputtering method, or a metal rolling method. The insulating base 44 also has the function of mechanically supporting the semiconductor device 42 (see FIG. 6A) in the manufacturing process.

The Cu foil 71 is partly removed by etching so as to form an opening. The through holes 47, 48, 49, and 50 are formed by irradiating the opening from above with a laser beam. Further, an electroless plating film is formed on the interior wall of the through holes 47, 48, 49, and 50 using an electroless plating method. Thereafter, the interior of the through holes 47, etc. is embedded by a plating film using a filling electroplating method. Since a filling electroplating method is employed in this step, the interior of the through holes 47, 48, 49, and 50 is completed embedded by the plating material.

Figure 7A:
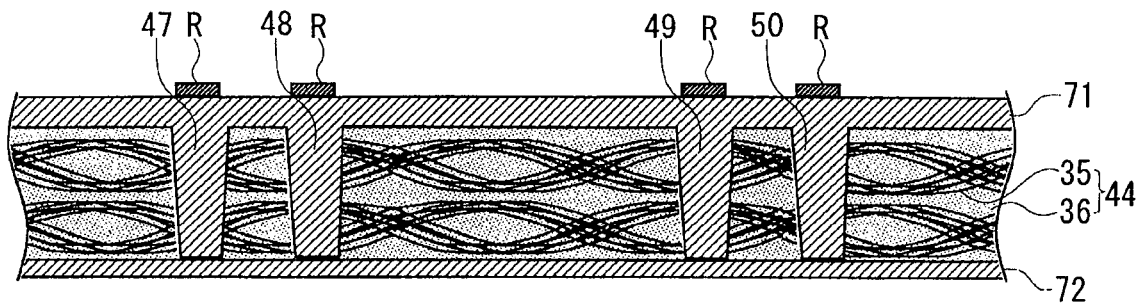
FIGS. 7A-7C are sectional views showing the method of manufacturing the circuit device according to the second embodiment of the present invention.
Figure 7B:
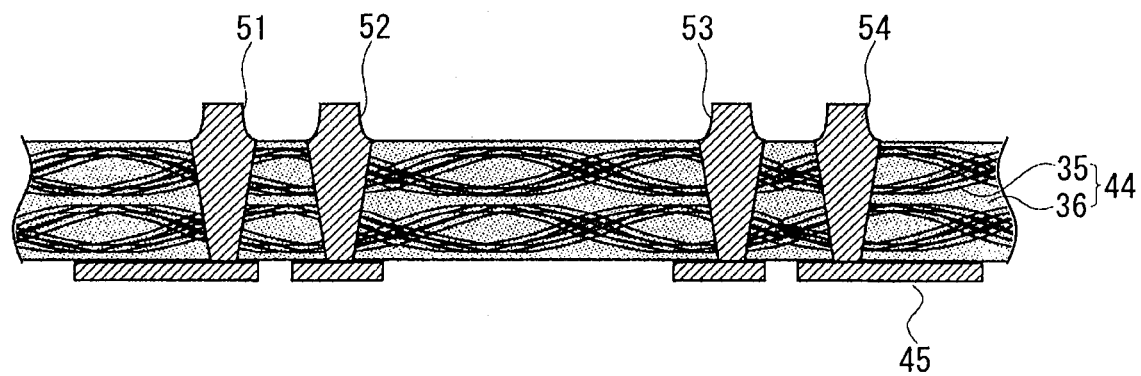

Referring to FIG. 7B, the Cu foil 71 and the Cu foil 72 are etched so as to form the wiring layer 45 and form the bumps 51, 52, 53, and 54.

More specifically, the Cu foil 71 on the surface of the insulating base 44 is etched so as to form the bumps 51, 52, 53, and 54. The Cu foil 71 is selectively etched using a resist R (see FIG. 7A) provided on the top surface of the Cu foil 71. This produces the bumps 51, 52, 53, and 54 projecting above the top surface of the insulating base 44.

Meanwhile, the Cu foil 72 on the bottom of the insulating base 44 is selectively etched to form the wiring layer 45.

Second Step: See FIG. 7C

Figure 7C:
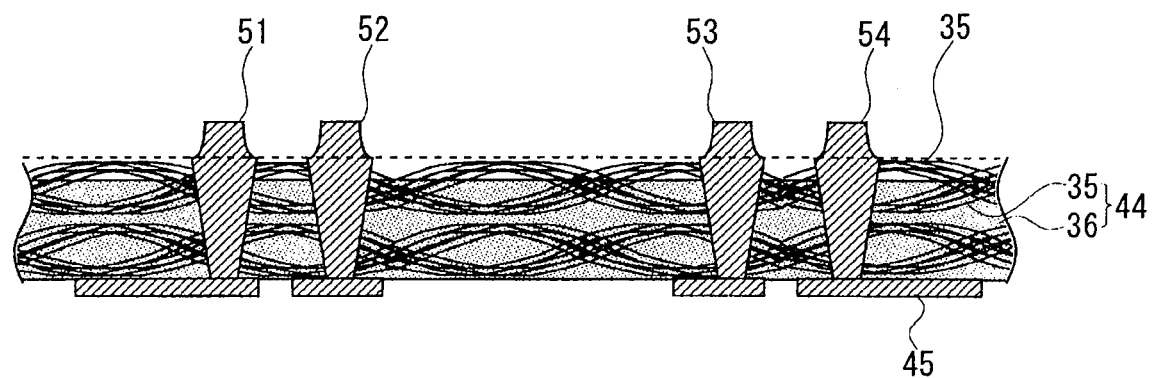

In this step, the insulating base 44 is etched from the top so as to cause the bumps 51, 52, 53, and 54 further above and to expose the fibrous filler 35 contained in the insulating base 44. In FIG. 7C, the top surface of the insulating base 44 before etching is indicated by a broken line.

More specifically, the insulating base 44 is etched from its surface so that the bumps 51, 52, 53, and 54 project at a desired height. The insulating base 44 may be dry etched or wet etched. In the case of dry etching, the insulating base 44 is etched in an atmosphere containing a mixture of oxygen and nitrogen, and using a plasma output of 50-150 (W). The duration of the step is 3-30 (min). In the case of wet etching, the insulating base 44 is etched using a water solution mainly containing sodium permanganate and sodium hydroxide as an etchant. The temperature of processing is 70-85 (° C.), and the duration of the step is 5-30 (min). As a result of the etching step, the bumps 51, 52, 53, and 54 of a size of about 10-30 (μm) are formed on the surface of the insulating base 44.

In this step, the etching rate of the material forming the fibrous filler 35 is smaller than the etching rate of the resin layer 36. Therefore, the resin layer 36 is immediately corroded in the etching step as described above but the fibrous filler 35 is not easily corroded. As a result, the uncorroded fibrous filler 35 remains and projects above the resin layer 36.

In this embodiment, the bumps 51, etc. are formed to project above the resin layer 36 in the first step and the resin layer 36 is further etched in the second step. This ensures that the bumps 51, etc. project above the resin layer 36 at an even greater height.

Third Step: See FIGS. 8A and 8B

In this step, the semiconductor device 42 is flip-chip mounted, and the sealing resin 70 for sealing the semiconductor device 42 is formed.

Figure 8A:
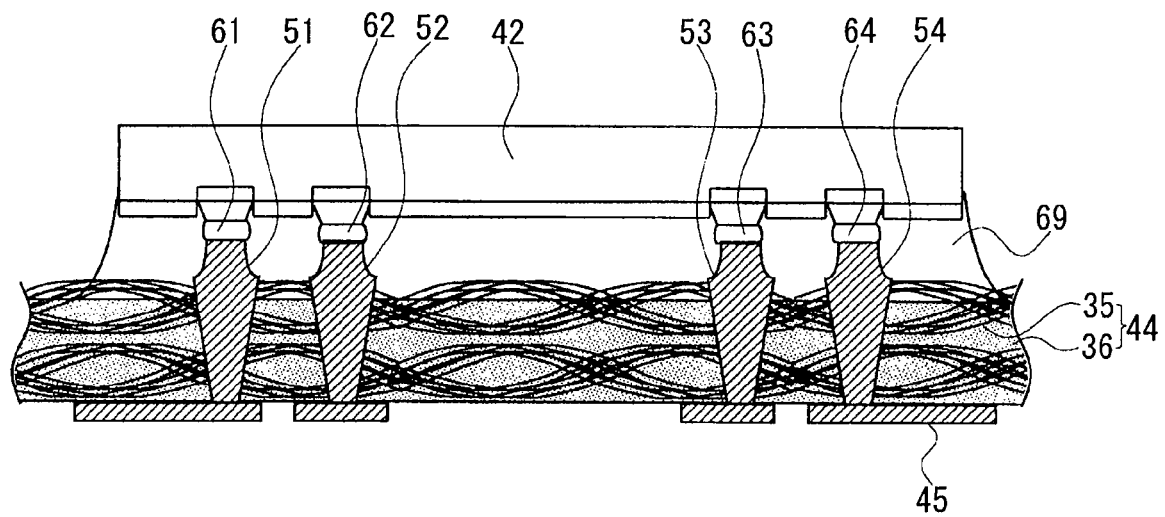
FIGS. 8A and 8B are sectional views showing the method of manufacturing the circuit device according to the second embodiment of the present invention.

Referring to FIG. 8A, the semiconductor device 42 is mounted on the bumps 51, 52, 53, and 54 used as bump electrodes. For example, the bumps 51, 52, 53, and 54 are coated with the conductive members 65, 66, 67, and 68 made of, for example, wax, using screen printing. The semiconductor device 42 is mounted on the insulating base 44 such that the bump electrodes 61, 62, 63, and 64 of the device 42 are mounted in alignment with the bumps 51, 52, 53, and 54, followed by the reflow of the bumps.

Subsequently, the gap between the semiconductor device 42 and the insulating base 44 is filled with the underfill 69. The liquid underfill 69 comprises, for example, epoxy resin and is injected from one side or two sides of the semiconductor device 42 using a capillary method. The underfill 69 is then heated and hardened. The viscosity of the underfill 69 is adjusted by controlling the amount of filler mixed in the underfill 69. The underfill 69 may comprise a resin sheet described in the first embodiment.

Further, the underfill 69 as used in this step is in contact with the fibrous filler 35 exposed from the resin layer 36. In other words, the fibrous filler 35 projecting as exposed is impregnated with the underfill 69. Therefore, the adhesion between the underfill 69 and the insulating base 44 is strong. Further, since the fibrous filler 35 is included in the underfill 69, heat dissipation of the underfill 69 is improved and the coefficient of thermal expansion of the underfill 69 is reduced.

Figure 8B:
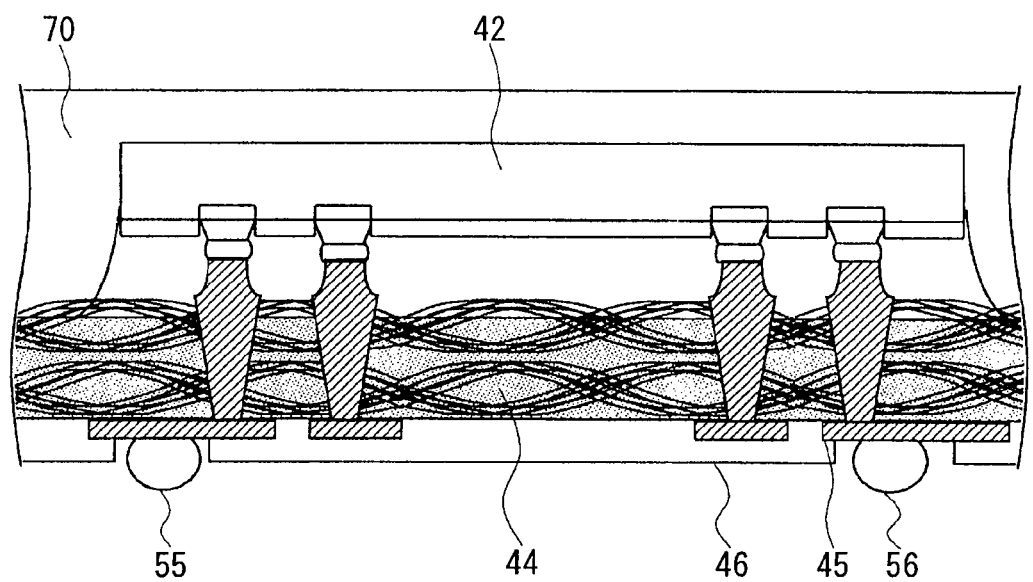

Referring to FIG. 8B, the sealing resin 70 is formed so as to cover the top surface of the semiconductor device 42 and the insulating base 44. The sealing resin 70 may be formed in a transfer molding process using a thermosetting resin or in an injection molding process using a thermoplastic resin.

Subsequently, the covering layer 46 is formed so as to cover the wiring layer 45 provided by patterning the bottom of the insulating base 44. The covering layer 46 comprises a thermosetting resin such as epoxy resin or a thermoplastic resin such as polyethylene. Those parts of the covering layer 46 where the external electrodes 55 and 56 are formed are provided with openings. The openings are used to form the external electrodes 55 and 56 as, for example, solder balls.

Third Embodiment

A description will now be given, with reference to FIGS. 9A-11B of the structure of yet another circuit device. The schematic structure of the circuit device described in this embodiment is the same as that of the other embodiments so that the following description of the circuit device of this embodiment mainly highlights the difference.

Figure 9A:
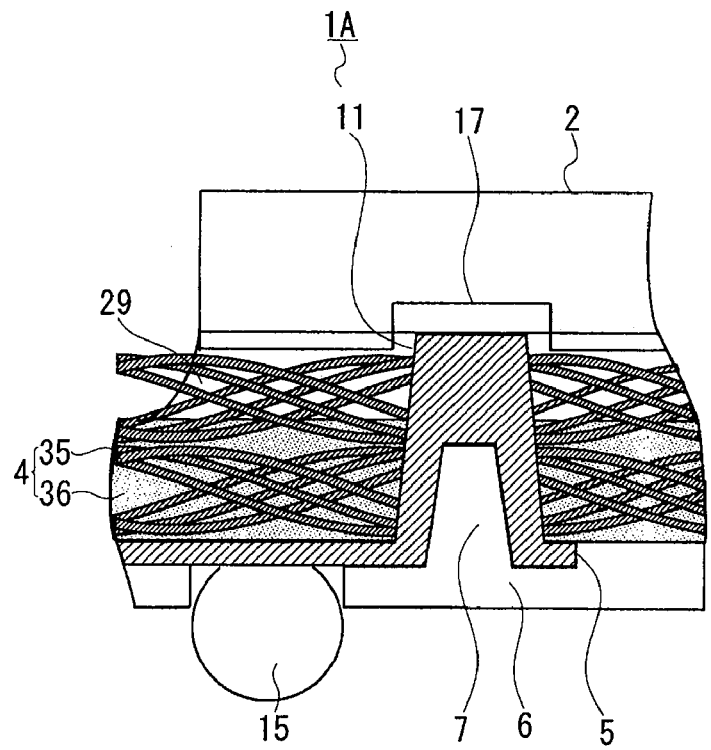
FIGS. 9A and 9B are sectional views showing the circuit device according to the third embodiment of the present invention.

In a circuit device 1A shown in FIG. 9A, a bump 11 is formed to project from the top surface of the insulating base 4. The top surface of the bump 11 is pressured welded (connected) to the bottom of the pad 17 of the semiconductor device 2. The fibrous filler 35 is exposed above the top surface of the resin layer 36 of the insulating base 4. The fibrous filler 35 as exposed is embedded in the underfill 29 filling a gap below the semiconductor device 2.

In the structure of the circuit device shown in FIGS. 1A and 1B, the semiconductor device 2 is connected via, for example, a bump electrode. In this embodiment, the top end of the bump 11 is directly connected to the semiconductor device 2 without using a bump electrode. This ensures that the portion filled by the underfill 29 (the space between the semiconductor device 2 and the insulating base 4) is narrow. Therefore, as compared with the first embodiment, the fibrous filler 35 is more firmly included in the underfill 29.

It is therefore ensured that the ratio of the fibrous filler 35 included in the underfill 29 (filling ratio) is equal to or greater than the rate in the resin layer 36, with the result that the underfill 29 and the base 4 have similar coefficients of thermal expansion. Consequently, heat stress developed at the interface between the underfill 29 and the insulating base 4 is reduced so that detachment of the underfill 29 from the insulating base 4 is prevented.

Further, since the ratio of the fibrous filler 35 included in the underfill 29 is increased, the thermal resistance of the underfill 29 as a whole is reduced so that heat dissipation of the circuit device as a whole is improved.

Figure 9B:
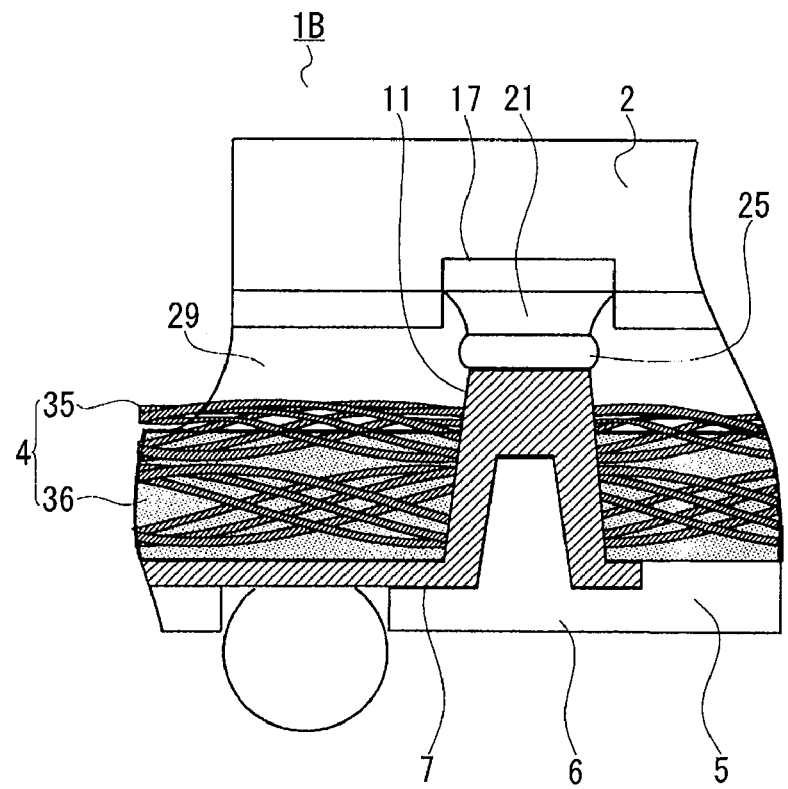

Referring to FIG. 9B, a circuit device 1B shown in the figure is configured such that the gap between the insulating base 4 and the semiconductor device 2 is filled with the underfill 29 while the fibrous filler 35 projecting above the resin layer 36 is collected on the top surface of the resin layer 36. With this structure, the ratio of the fibrous filler 35 included in the underfill 29 at the interface between the underfill 29 and the resin layer 36 is ensured to be larger than the ratio in the resin layer 36. Thus, the underfill 29 and the resin layer 36 are adhered to each other comparatively more strongly due to the fibrous filler 35 so that detachment of the underfill 29 from the insulating base 4 is prevented.

Such a structure may be applied to the circuit device 41 shown in FIG. 6.

Figure 10:
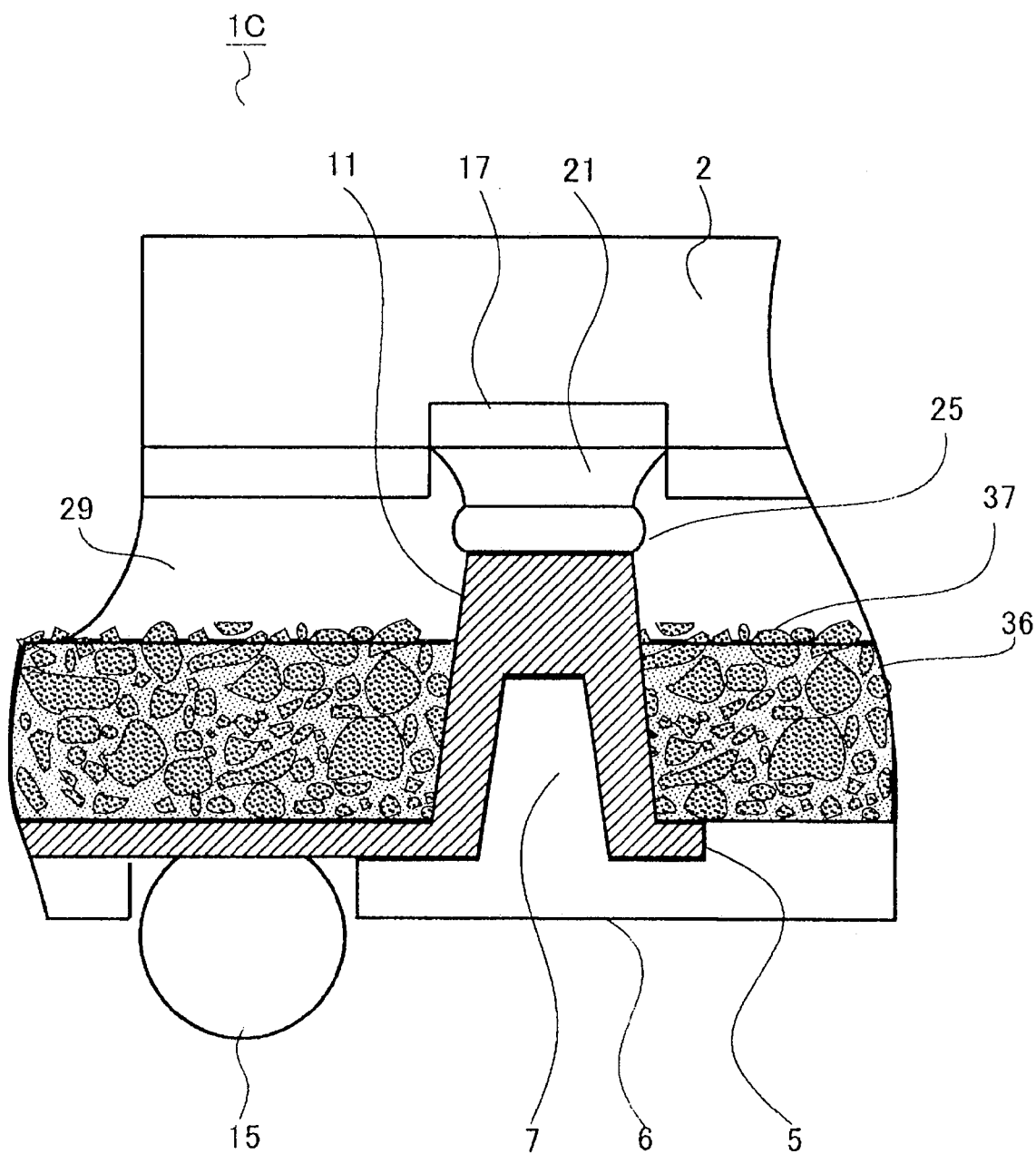
FIG. 10 is a sectional view showing the circuit device according to the third embodiment of the present invention.

A description will be given, with reference to FIG. 10, of the structure of yet another circuit device 1C. A particle filler 37 comprising silica ($SiO_2$) or alumina ($Al_2O_3$) is mixed in the resin layer 36. The underfill 29 is contact with the particle filler 37 exposed through the top surface of the resin layer 36. Such a structure also helps improve the adhesion between the resin layer 36 and the underfill 29 due to the filler included in the resin layer 36.

The structure involving the particle filler 37 shown in this figure may be applied to the circuit device shown in FIGS. 1A-1B, 6A-6B, and 9A-9B.

Figure 11A:
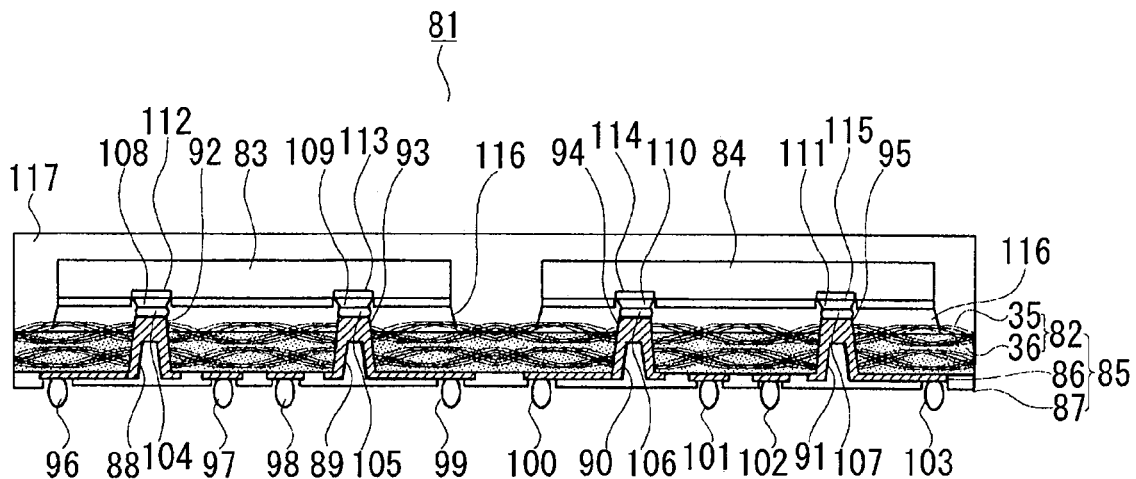
FIGS. 11A and 11B are sectional views showing the circuit device according to the third embodiment of the present invention.

A description will now be given, with reference to FIG. 11A, of a multichip module. The figure is a sectional view for illustrating a circuit device 81 formed as a multichip module.

As shown in the figure, the circuit device 81 is configured such that semiconductor devices 83 and 84 are mounted on an insulating base 82 and is formed as a multichip module. Since the semiconductor devices 83 and 84 are mounted on the insulating base 82 as a bare chip, a high packaging density is achieved and the size of the circuit device 81 is reduced. While the figure shows only two semiconductor devices 83 and 84, a large number of semiconductor devices (circuit devices) may be mounted.

A device mounting board 85 mainly comprises an insulating base 82, a wiring layer 86 formed on the insulating base 82, and a covering layer 87 covering the bottom of the insulating base 82. The insulating base 82 is configured such that the fibrous filler 35 is included in the resin layer 36. The fibrous filler 35 partly projects above the resin layer 36 and is included in an underfill 116.

The wiring layer 86 is formed by, for example, selectively etching a Cu plating layer formed by electrolyte plating. The wiring layer 86 is formed by patterning the bottom of the insulating base 82. The wiring layer 86 projects through the surface of the insulating base 82 via through holes 88, 89, 90, and 91 formed in the insulating base 82. Bumps 92, 93, 94, and 95 of the wiring layer 86 project above the through holes 88, 89, 90, and 91 and are used as bump electrodes.

The covering layer 87 covers the bottom of the insulating base 82. Those parts of the covering layer 87 where external electrodes 96, 97, 98, 99, 100, 101, 102, and 103 are formed are provided with openings.

The external electrodes 96, 97, 98, 99, 100, 101, 102, and 103 are formed as a ball grid array (BGA) provided on the bottom of the insulating base 82.

The semiconductor devices 83 and 84 (circuit device) is mounted on the bumps 92, 93, 94, and 95 via conductive members 104, 105, 106, and 107.

The underfill 116 is provided to fill the gap between the semiconductor devices 83, 84 and the insulating base 82. For example, the underfill 116 may comprise epoxy resin.

The sealing resin 117 may be formed in a transfer molding process using a thermosetting resin or in an injection molding process using a thermoplastic resin.

As in the foregoing embodiments, the advantage of improved strength of adhesion between the fibrous filler 35 and the underfill 116 is obtained in the circuit device 81, which is a multichip module, because the underfill 116 is in contact with the fibrous filler 35 projecting above the resin layer 36.

Figure 11B:
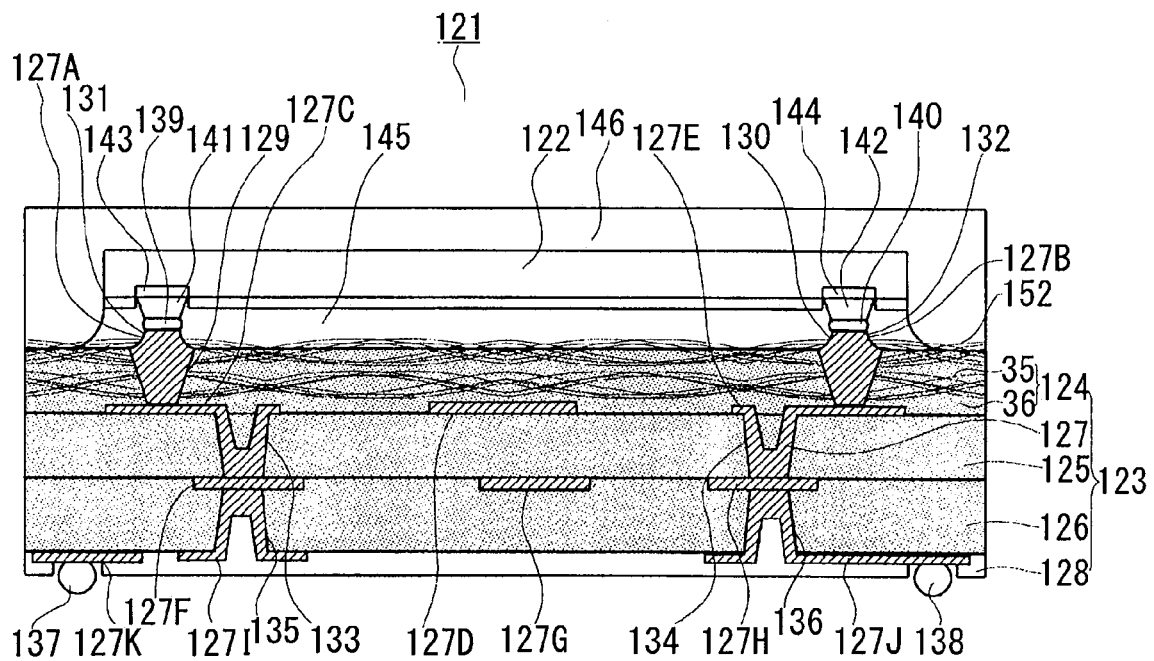

A description will now be given, with reference to FIG. 11B, of a circuit device 121 having a multilayer wiring structure.

A device mounting board 123 mainly comprises a first insulating base 124, a second insulating base 125, a third insulating base 126, three wiring layers 127 respectively formed in the first through third insulating bases 124, 125, and 126, and a covering layer 128 covering the bottom of the third insulating base 126. The covering layer 128 may or may not be provided on the bottom of the third insulating base 126.

Each of the first insulating base 124, the second insulating base 125, and the third insulating base 126 comprises a resin material and are stacked on each other. The insulating bases 124, 125, and 126 also have the function of mechanically supporting the semiconductor device 122 in the manufacturing process.

Through holes 129 and 130 are formed in the first insulating base 124. Wiring layers 127A and 127B are respectively embedded in the interior of the through holes 129 and 130. The wiring layers 127A and 127B are formed by, for example, using a filling electroplating method. The wiring layers 127A and 127B project through the surface of the first insulating base 124 and bumps 131 and 132 thereof are used as bump electrodes. The bumps 131 and 132 project above the surface of the first insulating base 124 by about 10-30 (μm). The height of projection is optionally designed depending on the usage.

Wiring layers 127C, 127D, and 127E are formed on the surface of the second insulating base 125. Wiring layers 127F, 127G, and 127H are formed on the bottom thereof. The wiring layer 127C is connected to the wiring layer 127A, extends to the bottom of the second insulating base 125 via a through hole 133, and is connected to the wiring layer 127F. Similarly, the wiring layer 127E is connected to the wiring layer 127B, extends to the bottom of the second insulating base 125 via a through hole 134, and is connected to the wiring layer 127H. The wiring layers 127C, 127D, and 127E are formed by, for example, selectively etching a Cu plating layer formed by electrolyte plating. The wiring layers 127F, 127G, and 127H are formed by, for example, etching a Cu foil pasted on the second insulating base 125.

Wiring layers 127I, 127J, and 127K are formed in the third insulating base 126. The wiring layer 127I is connected to the wiring layer 127F and extends to the bottom of the third insulating base 126 via a through hole 135. Similarly, the wiring layer 127J is connected to the wiring layer 127H, extends to the bottom of the third insulating base 126 via a through hole 136. The wiring layers 127I, 127J, and 127K are formed by, for example, selectively etching a Cu plating layer formed by electrolyte plating. The wiring layers 127I, 127J, and 127K are formed by patterning the bottom of the third insulating base 126.

The covering layer 128 covers the bottom of the third insulating base 126. Those parts of the covering layer 128 where external electrodes 137 and 138 are formed are provided with openings. The covering layer 128 comprises a thermosetting resin such as epoxy resin or a thermoplastic resin such as polyethylene.

The external electrodes 137 and 138 are formed as a ball grid array (BGA) provided on the bottom of the third insulating base 126.

The semiconductor device 122 (circuit device) is mounted on the bumps 131 and 132 via conductive members 139 and 140.

The description above concerns a case where bump electrodes 141 and 142 are formed on the semiconductor device 122 but the structure is not limited to the one described. For example, pads 143 and 144 of the semiconductor 122 may be directly electrically connected to the bumps 131 and 132 of the wiring layers 127A and 127B via the conductive members 139 and 140. Alternatively, a liquid resin or sheet resin may be used to achieve resin bonding.

An underfill 145 is provided to fill the gap between the semiconductor device 122 and the first insulating base 124. For example, the underfill 145 may comprise epoxy resin.

The sealing resin 146 may be formed in a transfer molding process using a thermosetting resin or in an injection molding process using a thermoplastic resin.

The first insulating base 124 comprises an insulating layer 36 mixed with the fibrous filler 35. The fibrous filler 35 projects through the top surface of the resin layer 36 and is included in the underfill 145. Advantageously, this will also prevent detachment of the underfill 145 and improves the thermal conductivity of the underfill 145.

While the figure shows that the fibrous filler 35 is mixed only in the first insulating base 124 on the topmost layer, the fibrous filler 35 may be mixed in all of the insulating bases.

Fourth Embodiment

Figure 12A:
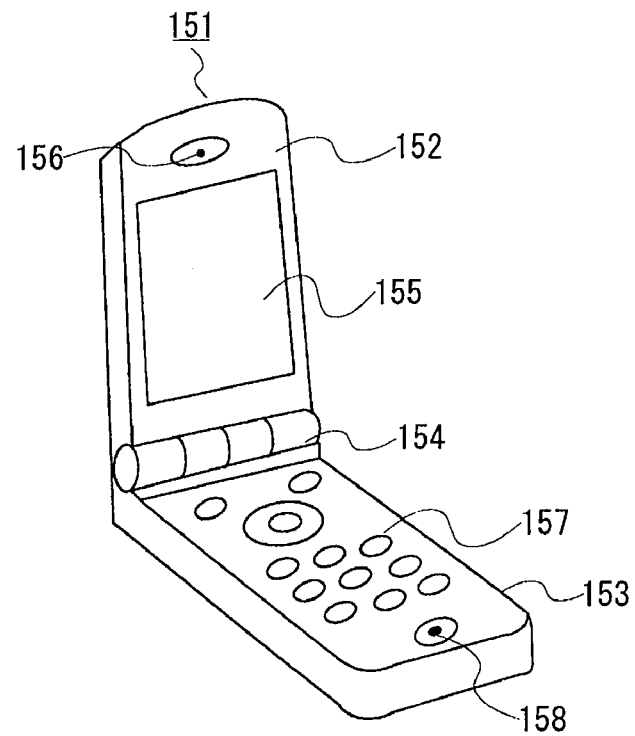
FIG. 12A is a perspective view showing the mobile device according to the fourth embodiment.
Figure 12B:
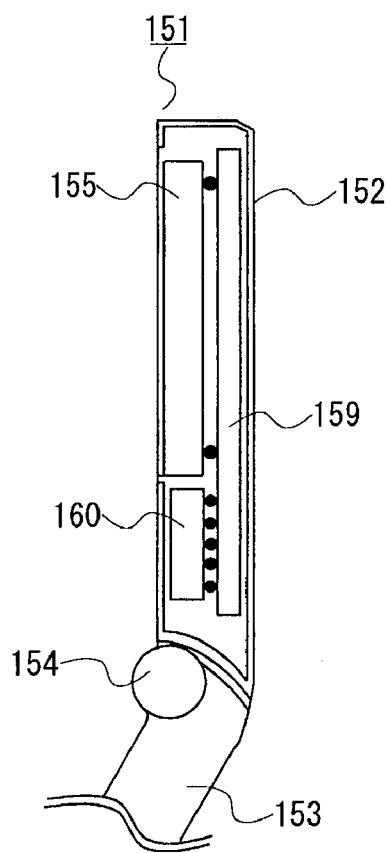
FIG. 12B is a sectional view showing the mobile device according to the fourth embodiment.
Figure 13:
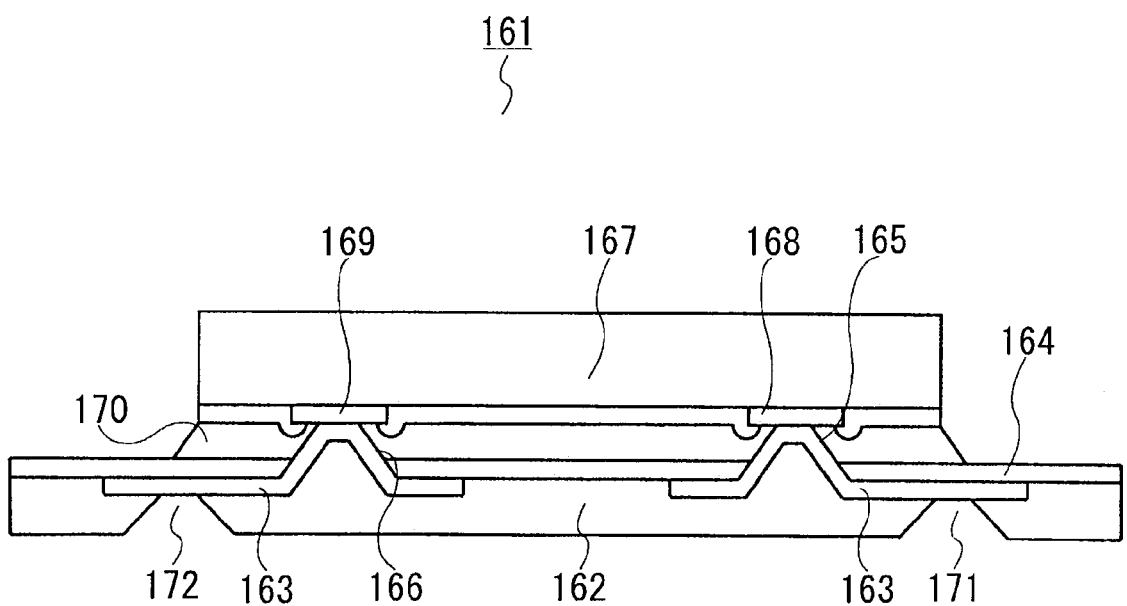
FIG. 13 is a sectional view showing the circuit board device according to the related art.
Figure 14A:
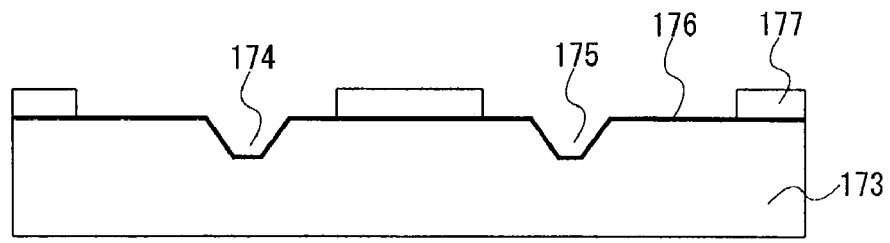
FIGS. 14A-14E are sectional views showing the method of manufacturing the circuit board device according to the related art.
Figure 14B:
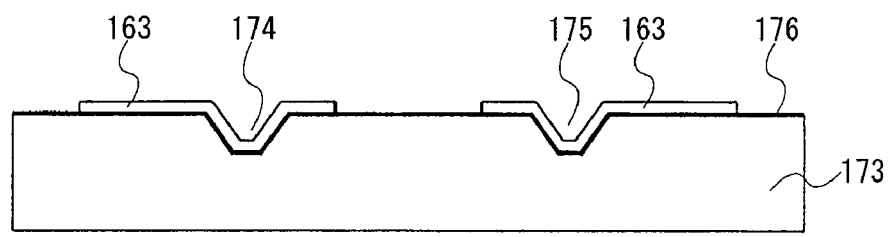
Figure 14C:
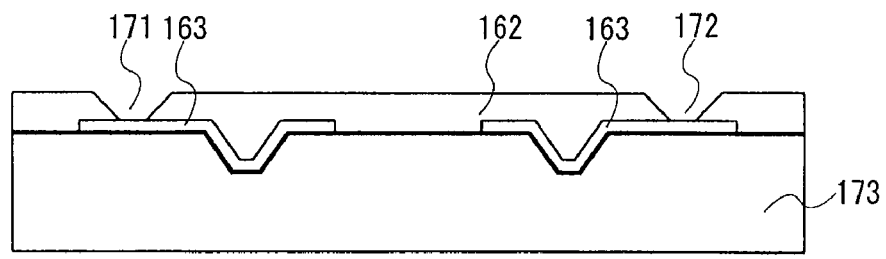
Figure 14D:
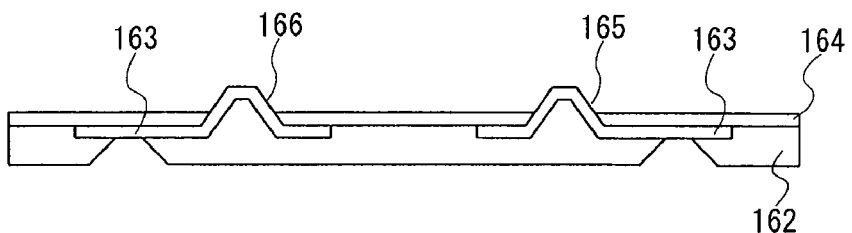
Figure 14E:
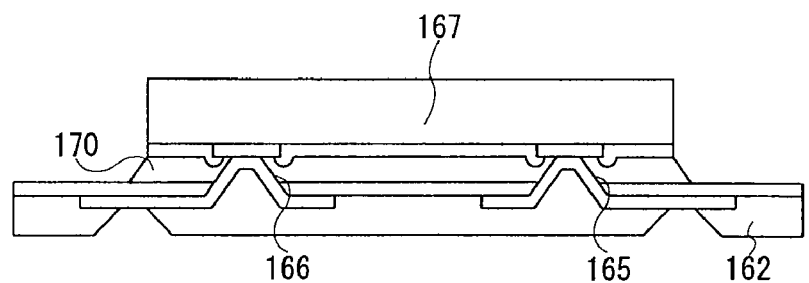

A description will be given, with reference to FIGS. 12A and 12B, of a mobile device, and, more particularly, a cell phone, in which the circuit device described above is installed. FIG. 12A is a perspective view showing a cell phone in which the circuit device of this embodiment is installed. FIG. 12B is a sectional view showing the internal structure of the cell phone according to this embodiment. The circuit device installed in the cell phone according to this embodiment may be any of the circuit devices according to the foregoing embodiments so that the description thereof will be omitted as appropriate.

As shown in FIG. 12A, a cell phone 151 comprises a device main body including a first casing 152 and a second casing 153. The first casing 152 and the second casing 153 are connected via a movable part 154. The first casing 152 and the second casing 152 can be rotated around the movable part 154.

A display unit 155 is provided in the first casing 152. The display unit 155 comprises, for example, a liquid crystal display (LC). Information represented by characters and images is displayed on the display unit 155.

A speaker 156 is provided above the display unit 155 of the first casing 152.

A control panel 157 is provided in the second casing 153. The control panel 157 comprises a power key for turning the device on, a mail key to activate a mail mode, a cross key, numeric keys, character keys, etc.

A microphone part 158 is provided toward the bottom of the control panel 157 of the second casing 153.

As shown in FIG. 12B, a printed board 159 is provided inside the first casing 152 toward its back. The display unit 155, a circuit device 160, etc. are mounted on the printed board. The circuit device 160 and the display unit 155 are electrically connected to each other via a wiring layer on the printed board 159. The circuit device 160 according to this embodiment is used as, for example, a power supply circuit for driving the circuit, an RF generation circuit for generating a radio frequency, a digital analog converter (DAC) circuit, an encoder circuit, or a driver circuit for driving a backlight source for a liquid crystal panel.

The description above concerns a cell phone as a mobile device but the description is not limited as to the type of device. For example a mobile device may also be an electronic device such as a personal digital assistants (PDA), a digital video camera (DVC), a music player, and a digital still camera (DSC).

A description will be given of other aspects of the invention by describing the fifth through seventh embodiments in the following. The description below concerns a device mounting board, a semiconductor module, and a method of manufacturing a device mounting board.

The background technology for the fifth through seventh embodiments will be described. The advancement in performance and functions of circuit devices such as large scale integrated circuits (LSIs) in recent years demand increased power consumption. As the size of electronic devices is reduced, size reduction and higher density in device mounting boards are called for. As a result of associated increase in power consumption (heat density) per unit volume of a circuit board, there is a growing need for measures for heat dissipation.

Meanwhile, flexible substrates have come to be used quite often to address the requirement for improvement of flexibility in device design. For example, a flexible substrate comprises a support film made of an insulator, and a metal wiring layer configured to be in contact with the support film. A flexible substrate is extremely thin and light as compared to a rigid printed circuit board. As such, a flexible substrate is quite useful to reduce the size and weight of a device. There is also known a circuit substrate having an insulating layer in which glass fiber is mixed in a resin for the purpose of improving the strength and functionality of the device (see, for example, JP 2007-227809).

A description will be given of the goal addressed by the fifth through seventh embodiments. In the background as described above, the present invention has a purpose of providing a technology that provides a device mounting board capable of dissipating heat efficiently and a semiconductor module provided with such a board.

A description will be given of means to achieve the goal in the fifth through seventh embodiments. The device mounting board addressing the above-mentioned goal comprises: an insulating layer made of an insulating resin and including a filler having a higher thermal conductivity than the resin; and an electrode provided in the insulating layer. The filler includes an exposed part exposed through the surface of the insulating layer on which the electrode is exposed.

According to this embodiment, heat generated as a semiconductor device installed in the package is operated can be dissipated via the filler, which has higher thermal conductivity than the resin of the insulating layer.

Another embodiment of the present invention relates to a semiconductor module. The semiconductor module comprises a semiconductor device and a device mounting board. The exposed part is in contact with the surface of the semiconductor device.

According to the embodiment, a semiconductor module capable of dissipating heat from a semiconductor device in operation via the filler, which has a higher thermal conductivity than the resin of the insulating layer is implemented in a simple structure, Another embodiment of the present invention relates to a device mounting board. The method comprises: preparing a substrate made of an insulating resin and having an insulating layer that includes a filler with a higher thermal conductivity than the resin; forming an electrode on the insulating layer; and removing the surface of the insulating layer on which the electrode is exposed so as to expose a part of the filler.

According to the embodiment, a device mounting board capable of dissipating heat efficiently can be manufactured easily.

According to the invention, heat dissipation of a device mounting board and a semiconductor module provided with the board can be improved.

A description will now be given of the best mode of implementing the fifth through seventh embodiments. A description will now be given, with reference to the drawings, of the embodiments embodying the present invention. Identical elements in the drawings are designated by the same reference numbers so that the redundant description will be omitted as appropriate. The structure described below is illustrative and is not limited as to the scope of the present invention.

Fifth Embodiment

Figure 15:
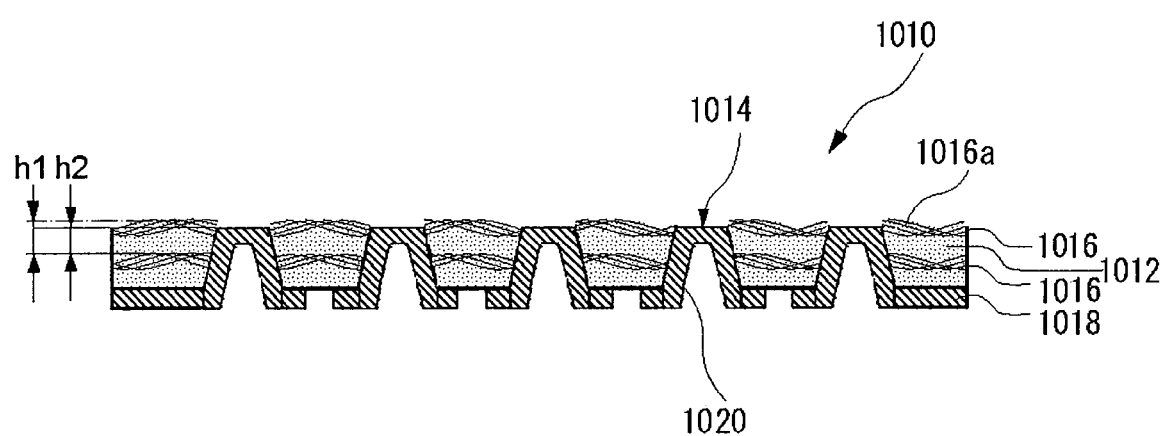
FIG. 15 is a sectional view showing the schematic structure of the device mounting board according to the fifth embodiment.

FIG. 15 is a sectional view showing the schematic structure of a device mounting board according to the fifth embodiment. A device mounting board 1010 comprises an insulating layer 1012 made of an insulating resin and an electrode 1014 provided on the insulating layer 1012. The insulating layer 1012 includes a glass cloth 1016 as a filler having a higher thermal conductivity than the resin contained in the insulating layer 1012. The glass cloth 1016 is a fibrous filler provided such that the fiber is oriented in a direction intersecting the direction perpendicular to the surface of the substrate. The thermal conductivity of the resin according to this embodiment is about 0.2 W/m*K, and the thermal conductivity of the glass cloth 1016 is about 1.0 W/m*K. The glass cloth 1016 has an exposed part 1016a exposed through the surface of the insulating layer 1012 on which the electrode 1014 is exposed.

Therefore, when a semiconductor device formed with a circuit using a well-known technology is mounted on the device mounting board 1010 and operated, heat generated in the semiconductor device is dissipated via the glass cloth 1016 having a higher thermal conductivity than the resin.

The device mounting board 1010 is formed with a wiring layer 1018 on the bottom of the insulating layer 1012 shown in FIG. 15. The electrode 1014 according to the embodiment is formed in a hole extending through the insulating layer 1012 and includes a via conductor 1020 having one end thereof electrically connected to the wiring layer 1018. In other words, the via conductor 1020 operates as an electrode having the other end connected to a terminal of a semiconductor device.

The glass cloth 1016 toward the side of the insulating layer 1012 not formed with the wiring layer 1018 may be configured such that the height h1 of at least a part of the exposed part 1016a is higher than the height h2 of the electrode 1014.

In this case, the height may be interpreted as the degree of irregularity in the direction perpendicular to a reference surface parallel to the surface of the insulating layer 1012. In this way, when a semiconductor device is mounted on the device mounting board 1010 so that the terminal of the semiconductor device is connected to the electrode 1014, the exposed part 1016a is likely to be in contact with the semiconductor device, allowing heat to be dissipated efficiently.

A description will now be given of a method of manufacturing the device mounting board 1010. FIGS. 16A-18B are sectional views showing steps performed in the method of manufacturing the device mounting board according to the fifth embodiment.

Figure 16A:
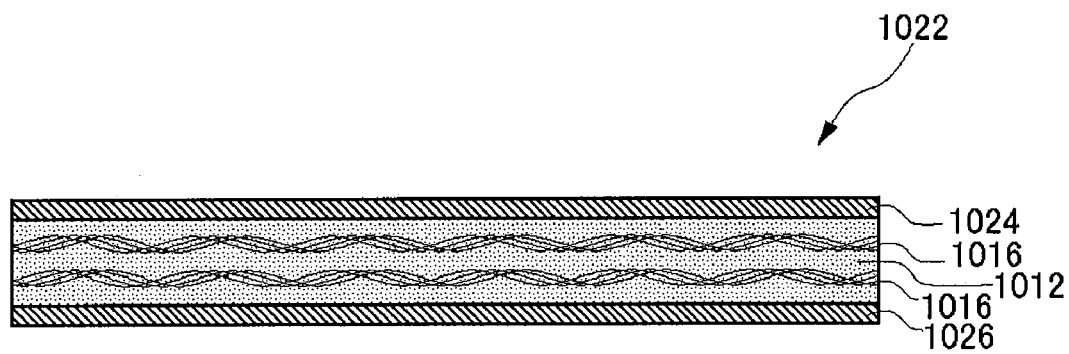
FIGS. 16A and 16B are sectional views showing steps performed in the method of manufacturing the device mounting board according to the fifth embodiment.

First, as shown in FIG. 16A, a substrate 1022 made of an insulating resin and having an insulating layer 1012 that includes a glass cloth 1016 with a higher thermal conductivity than the resin is prepared. A first conductive film 1024 is formed on one surface of the insulating layer 1012 and a second conductive film 1026 is formed on the other surface thereof.

Figure 16B:
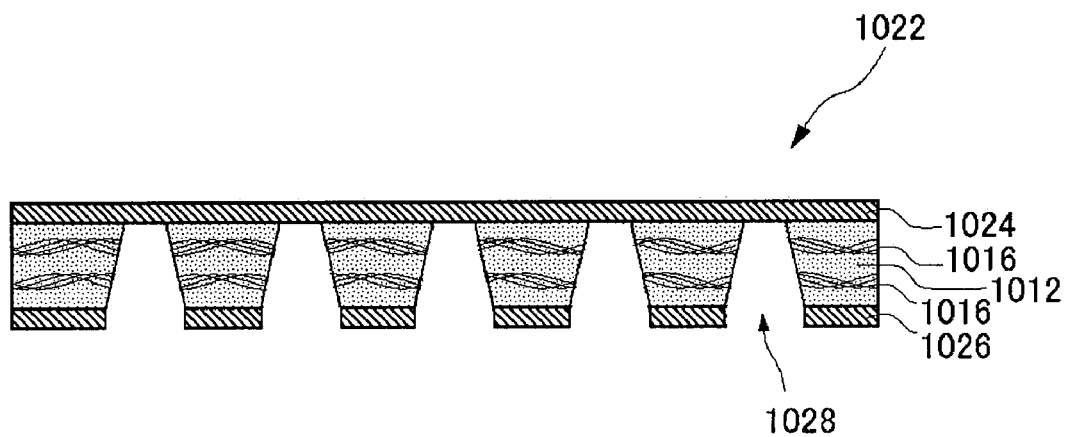

Subsequently, as shown in FIG. 16B, the second conductive film 1026 is irradiated with laser so as to remove a part of the insulating layer 1012 until the first conductive film 1024 is exposed, thereby forming an opening 1028. For laser irradiation, $CO_2$ gas laser may be used by way of example. Laser irradiation is conducted in two steps, i.e., in the first irradiation condition in which the layer is etched by a high-energy beam to a desired depth, and then in the second irradiation condition in which the via side wall is shaped using a low-energy beam. As a result, an opening 1028 having a diameter of about 80-100 μm and having a tapered side wall with a progressively smaller diameter away from the surface of the insulating layer 1012 and toward the first conductive film 1024 is formed as a via.

Figure 17A:
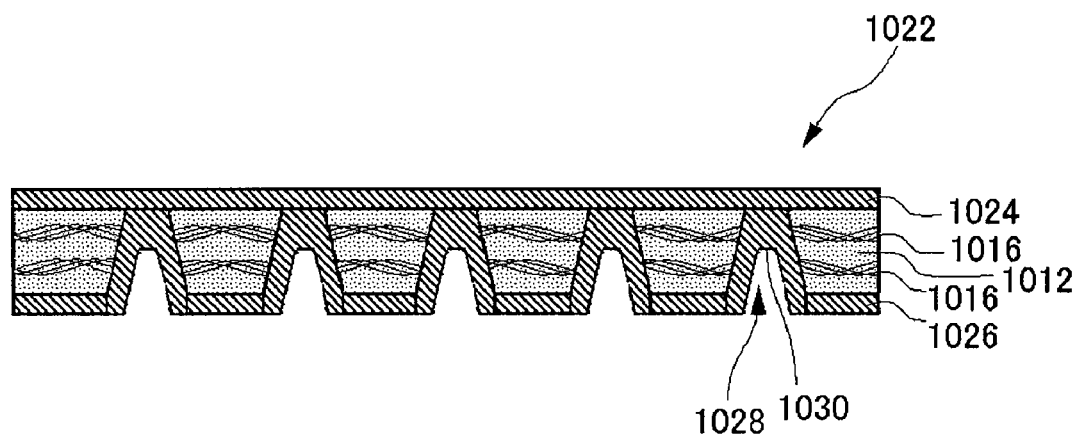
FIGS. 17A and 17B are sectional views showing steps performed in the method of manufacturing the device mounting board according to the fifth embodiment.
Figure 17B:
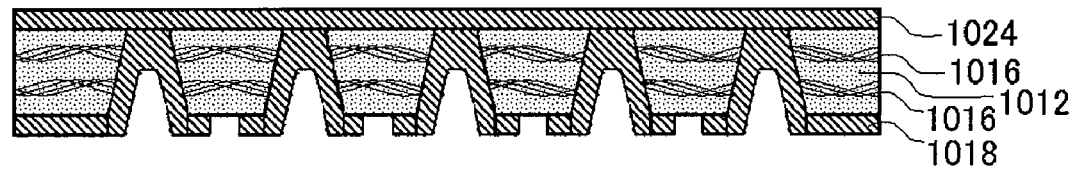

Subsequently, as shown in FIG. 17A, electroless plating or electroplating is used to plate the interior of the opening 1028 with copper to a thickness of about 20 μm. As a result, a via conductor 1030 is formed inside the opening 1028 so that electrical connection is established between the first conductive film 1024 and the second conductive film 1026 via the via. Subsequently, as shown in FIG. 17B, a publicly known method is used to etch the second conductive film 1026 according to a predefined pattern so as to form the wiring layer 1018.

Figure 18A:
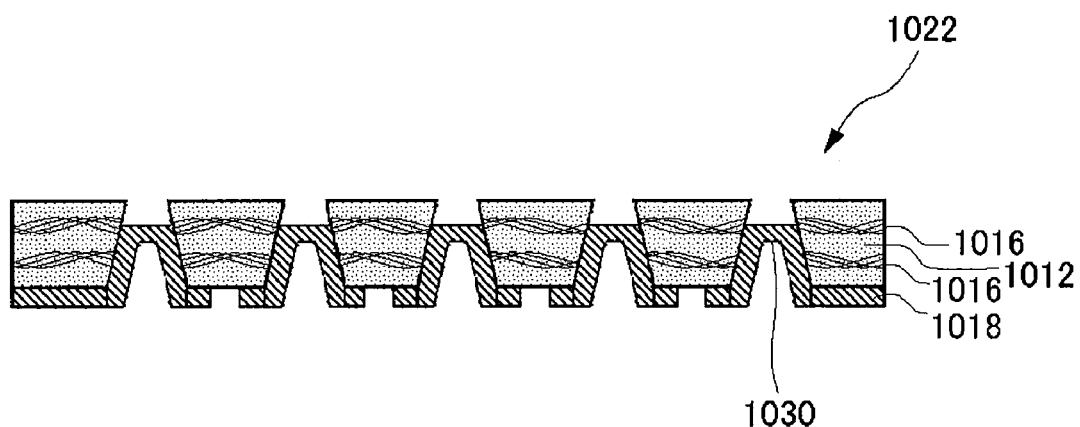
FIGS. 18A and 18B are sectional views showing steps performed in the method of manufacturing the device mounting board according to the fifth embodiment.
Figure 18B:
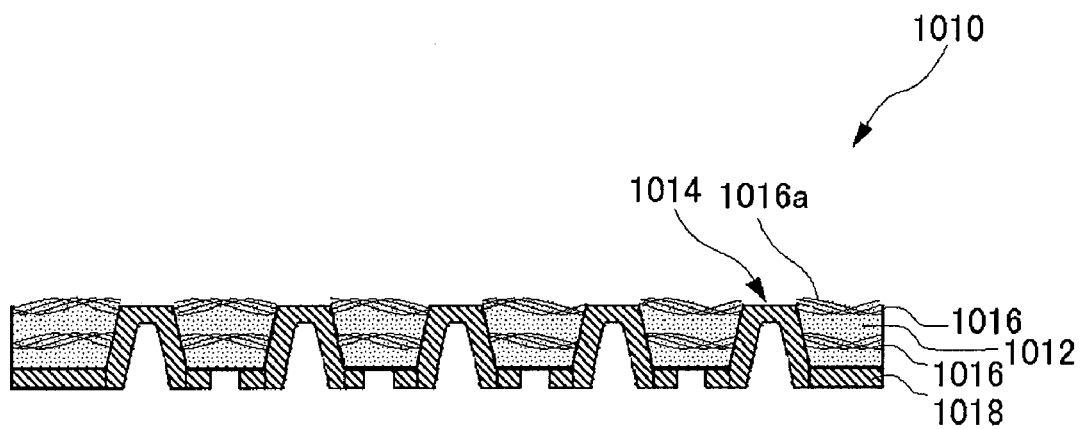

Subsequently, as shown in FIG. 18A, the first conductive film 1024 is detached and a part of the via conductor 1030 is removed by etching. This will form the electrode 1014 on the insulating layer 1012. Subsequently, as shown in FIG. 18B, the resin on the surface of the insulating layer 1012 on which the electrode 1014 is exposed is dissolved and removed, exposing a part of the glass cloth 1016. The device mounting board 1010 is thus produced. As described, according to this embodiment, the device mounting board 1010 capable of dissipating heat efficiently is manufactured easily. Since an electrode according to this embodiment is formed by removing a part of the via conductor 1030, a device mounting board in which the height of the exposed part 1016a is higher than the height of the electrode 1014 is manufactured easily.

Figure 19A:
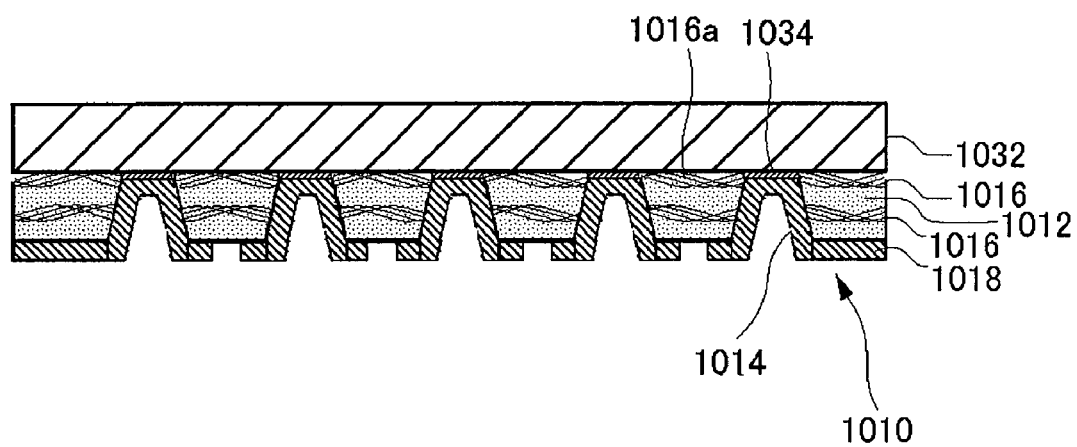
FIGS. 19A and 19B are sectional views showing steps performed in the method of manufacturing the semiconductor module according to the fifth embodiment.
Figure 19B:
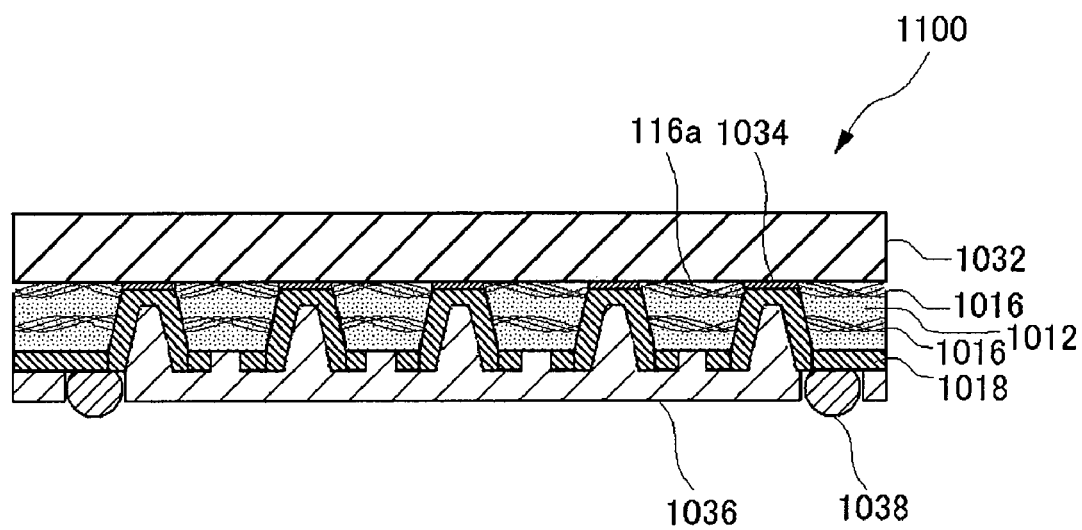

FIGS. 19A and 19B are sectional views showing the steps performed in the method of manufacturing a semiconductor module according to the fifth embodiment. First, as shown in FIG. 19A, a semiconductor device 1032 such as an LSI or an IC is mounted on the device mounting board 1010. In this process, a terminal 1034 of the semiconductor device 1032 is metallically bonded to an electrode 1014 of the device mounting board 1010 by pressure bonding. The pressure of bonding may be, for example, about 1.5 MPa. In this embodiment, it is assumed that copper is used both in the terminal 1034 and the electrode 1014. Alternatively, the copper surface may be plated with gold so that the gold surfaces are pressure bonded.

Subsequently, as shown in FIG. 19B, the wiring layer 1018 is covered by a solder resist layer 1036. The solder resist layer 1036 functions as a protective film for the wiring layer 1018 and may comprise epoxy resin. A solder printing method is used form a bump 1038 that functions as a connection terminal for that part of the wiring layer 1018 exposed through the opening of the solder resist layer 1036. Thereby, the production of the semiconductor module 1100 is completed.

As shown in FIG. 19B, the semiconductor module 1100 is configured such that the exposed part 1016a of the glass cloth 1016 is in contact with the surface of the semiconductor device 1032 provided with the terminal 1034. Thus, the semiconductor module 1100 according to this embodiment is capable of dissipating heat from the semiconductor device 1032 via the glass cloth 1016 having a higher thermal conductivity than the resin of the insulating layer 1012.

Sixth Embodiment

The semiconductor module 1100 according to the fifth embodiment is configured such that the terminal 1034 and the electrode 1014 are directly metallically bonded. In the semiconductor module according to the sixth embodiment, the terminal 1034 and the electrode 1014 are soldered. The following description concerns a difference from the fifth embodiment.

FIGS. 20A-21B are sectional views showing the steps performed in the method of manufacturing a device mounting board according to the sixth embodiment. The device mounting board according to this embodiment is manufactured using the substrate 1022 formed with the opening 1028 by laser as in the step shown in FIGS. 16A and 16B.

Figure 20A:
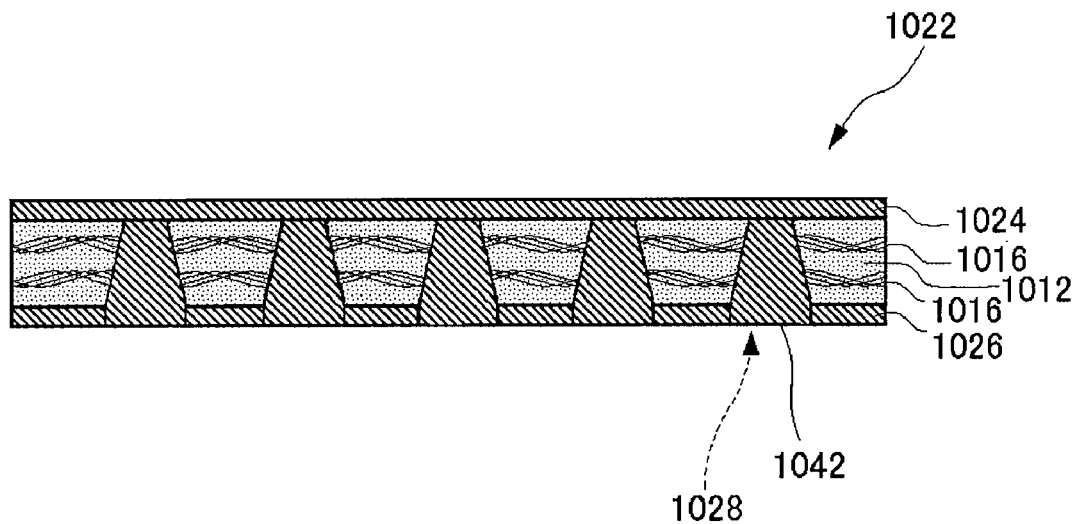
FIGS. 20A and 20B are sectional views showing steps performed in the method of manufacturing the device mounting board according to the sixth embodiment.
Figure 20B:
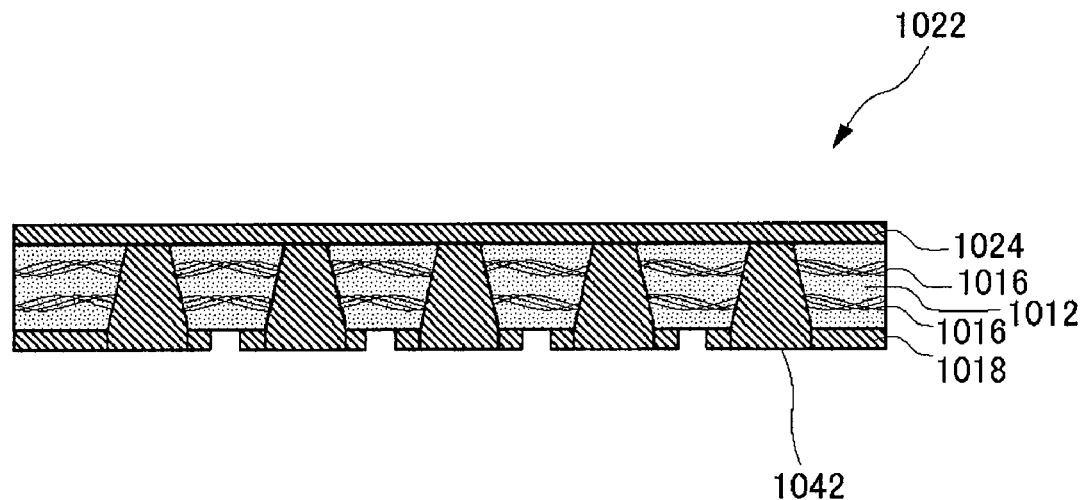

As shown in FIG. 20A, according to the package manufacturing method according to the sixth embodiment, the opening 1028 is entirely filled with copper by electroless plating or electroplating. As a result, a via conductor 1042 is formed inside the opening 1028. Electrical connection is established between the first conductive film 1024 and the second conductive film 1026 via the via. Subsequently, as shown in FIG. 20B, a publicly known method is used to etch the second conductive film 1026 according to a predefined pattern so as to form the wiring layer 1018.

Figure 21A:
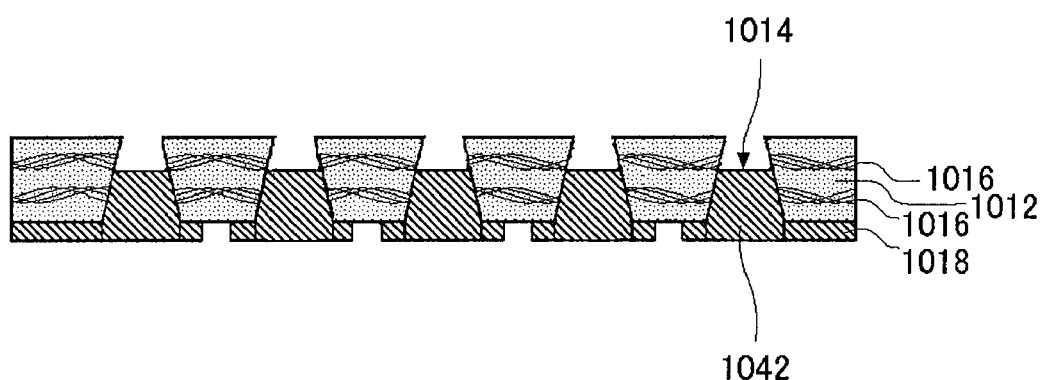
FIGS. 21A and 21B are sectional views showing steps performed in the method of manufacturing the device mounting board according to the sixth embodiment.

Subsequently, as shown in FIG. 21A, the first conductive film 1024 is detached and a part of the via conductor 1042 is removed by etching. This forms the electrode 1014 in the insulating layer 1012. Since the opening is entirely filled with the via conductor 1042, the via conductor 1042 is prevented from being formed with a through hole even if a large amount of the via conductor 1042 is removed by etching.

Figure 21B:
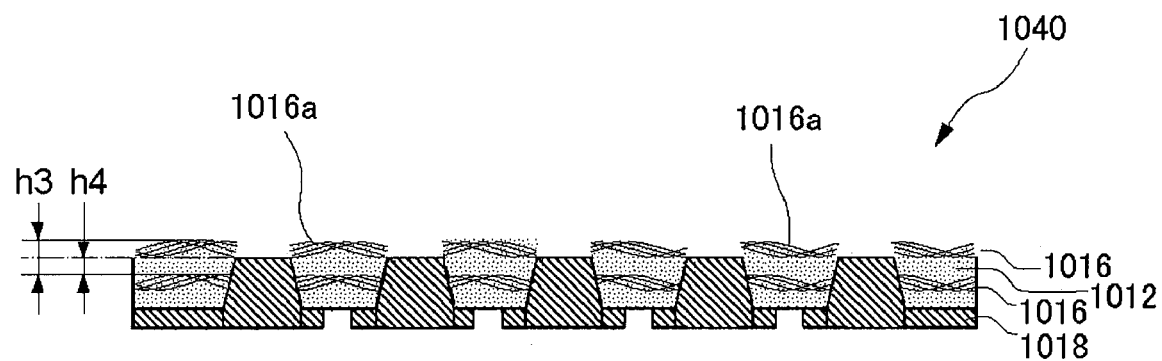

Etching a large amount of the via conductor 1042 results in a large step difference between the surface of the via conductor 1042 receded from the insulating layer 1012, and the surface of the insulating layer 1012. Thus, as shown in FIG. 21B, when the resin on the surface of the insulating layer 1012 on which the electrode 1014 is exposed is dissolved and removed, the exposed part 1016a of the glass cloth 1016 is increased accordingly, resulting in a large difference between the height h3 of the exposed part 1016a and the height h4 of the electrode 1014. Thus, according to this embodiment, a device mounting board 1040 capable of dissipating heat more efficiently can be manufactured easily. Since a part of the via conductor 1042 is removed to form an electrode according to this embodiment, a device mounting board in which the height of the exposed part 1016*a* is greater than the height of the electrode 1014 can be manufactured easily.

Figure 22A:
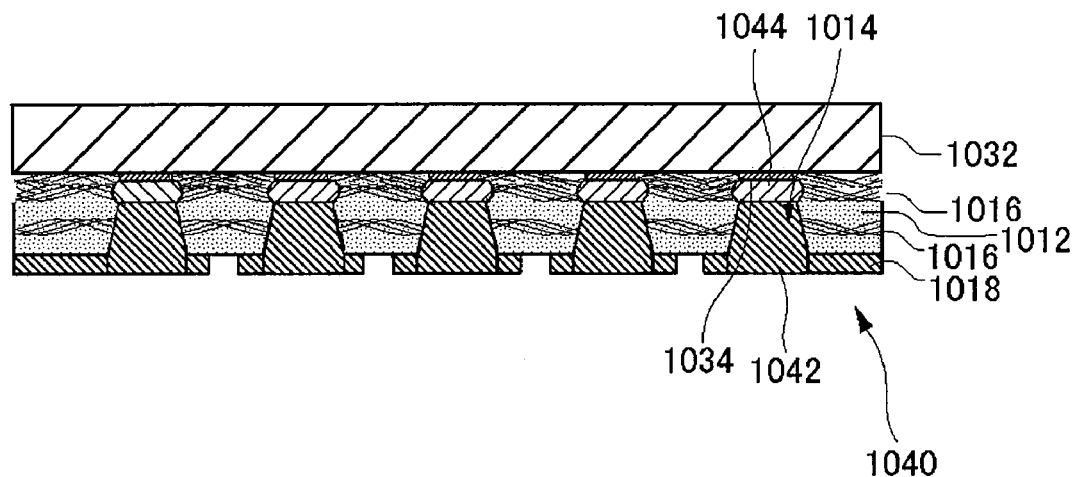
FIGS. 22A and 22B are sectional views showing steps performed in the method of manufacturing the semiconductor module according to the sixth embodiment.
Figure 22B:
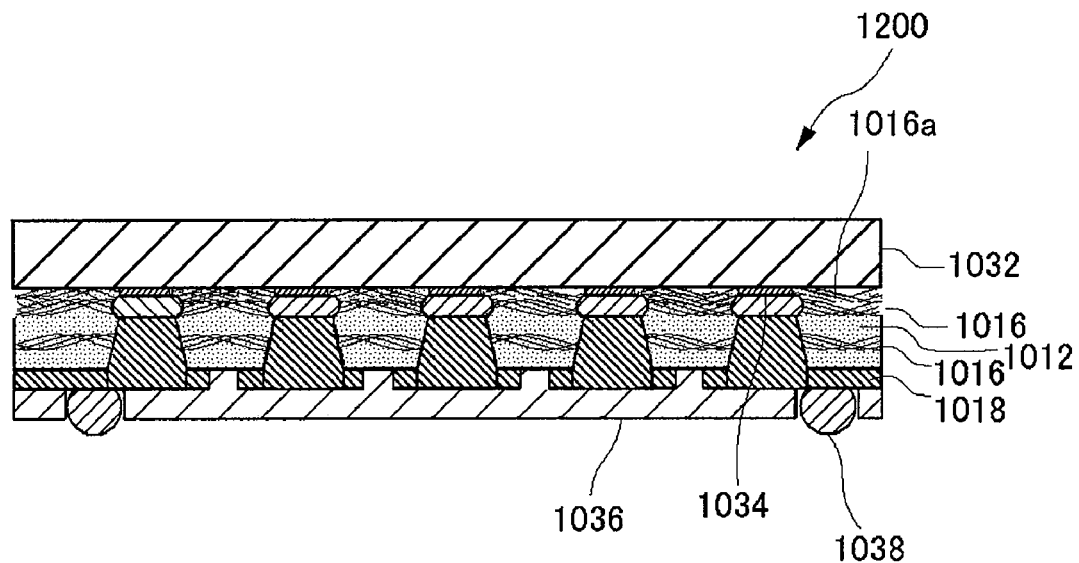

FIGS. 22A and 22B are sectional views showing the steps performed in the method of manufacturing a semiconductor module according to the sixth embodiment. First, as shown in FIG. 22A, a semiconductor device 1040 such as an LSI or an IC is mounted on the device mounting board 1040. In this process, the terminal 1034 of the semiconductor device 1032 is connected to the electrode 1014 of the device mounting board 1010 by a solder 44. As mentioned above, the device mounting board 1040 is configured such that the difference between the height h3 of the exposed part 1016*a* and the height h4 of the electrode 1014 is greater than in the device mounting board 1010 according to the fifth embodiment. Therefore, a semiconductor module can be manufactured using a thick layer of solder 44 so that the flexibility of manufacturing is increased.

Subsequently, as shown in FIG. 22B, the wiring layer 1018 is covered by a solder resist layer 1036. The solder resist layer 1036 functions as a protective film for the wiring layer 1018 and may comprise epoxy resin. A solder printing method is used form a bump 1038 that functions as a connection terminal for that part of the wiring layer 1018 exposed through the opening of the solder resist layer 1036. Thereby. the production of the semiconductor module 1200 is completed.

As shown in FIG. 22B, the semiconductor module 1200 is configured such that the exposed part 1016*a* of the glass cloth 1016 is in contact with the surface of the semiconductor device 1032 provided with the terminal 1034. Thus, the semiconductor module 1200 according to this embodiment is capable of dissipating heat from the semiconductor device 1032 via the glass cloth 1016 having a higher thermal conductivity than the resin of the insulating layer 1012.

Seventh Embodiment

In the semiconductor modules as described above, the terminal of a semiconductor device is provided to project from the surface. In this embodiment, the terminal of a semiconductor device is provided at a location receded from the surface.

Figure 23A:
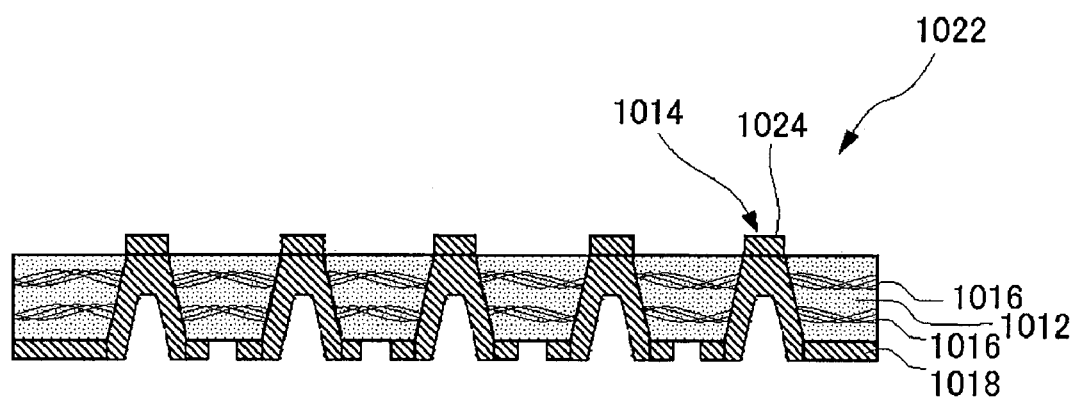
FIGS. 23A and 23B are sectional views showing steps performed in the method of manufacturing the device mounting board according to the seventh embodiment.
Figure 23B:
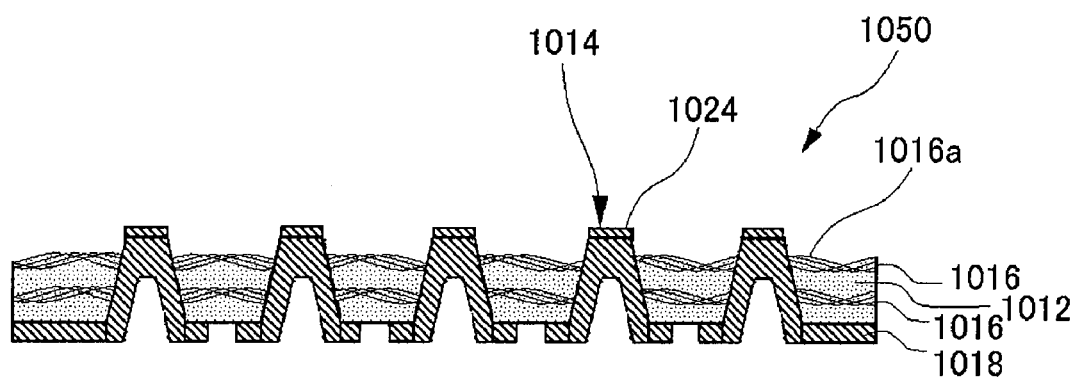

FIGS. 23A-23B are sectional views showing the steps performed in the method of manufacturing a device mounting board according to the seventh embodiment. The device mounting board according to the seventh embodiment is manufactured using the substrate 1022 provided with the wiring layer 1018 using the steps shown in FIGS. 17A and 17B.

As shown in FIG. 23A, according to the device mounting board manufacturing method according to this embodiment, a part of the conductive film 1024 is removed by etching and the other parts are allowed to remain as a wiring layer that functions as the electrode 1014. In this way, the electrode 1014, which includes the wiring layer, is formed in the insulating layer 1012, without requiring the step of removing a part of the via conductor 1030. Subsequently, as shown in FIG. 23B, the resin on the surface of the insulating layer 1012 on which the electrode 1014 is exposed and from which the first conductive film 1024 is removed is dissolved and removed, exposing a part of the glass cloth 1016. A device mounting board 1050 is thus produced. As described, according to this embodiment, the device mounting board 1050 capable of dissipating heat efficiently is manufactured easily.

Since a part of the first conductive film 1024 is allowed to remain and is used as the electrode 1014 according to this embodiment, a device mounting board in which the height of the exposed part 1016*a* is less than the height of the electrode 1014 is manufactured easily.

Figure 24A:
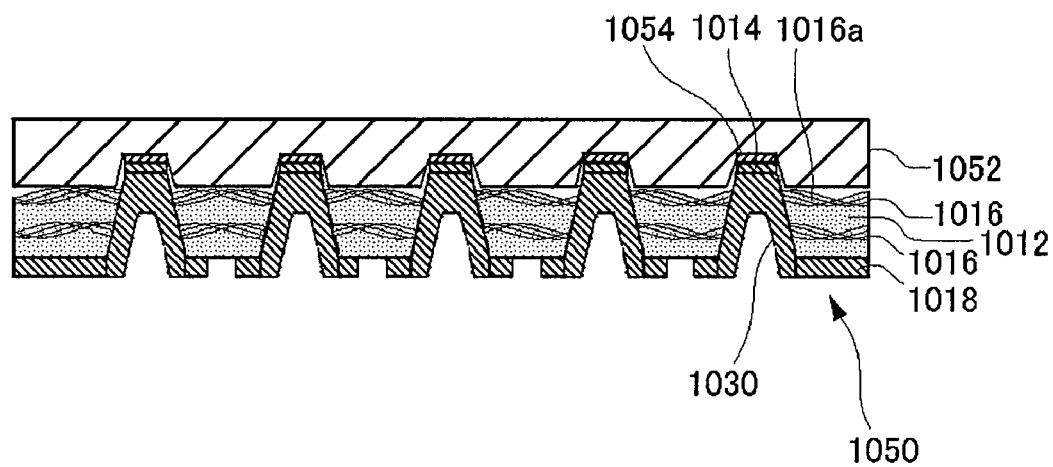
FIGS. 24A and 24B are sectional views showing steps performed in the method of manufacturing the semiconductor module according to the seventh embodiment.
Figure 24B:
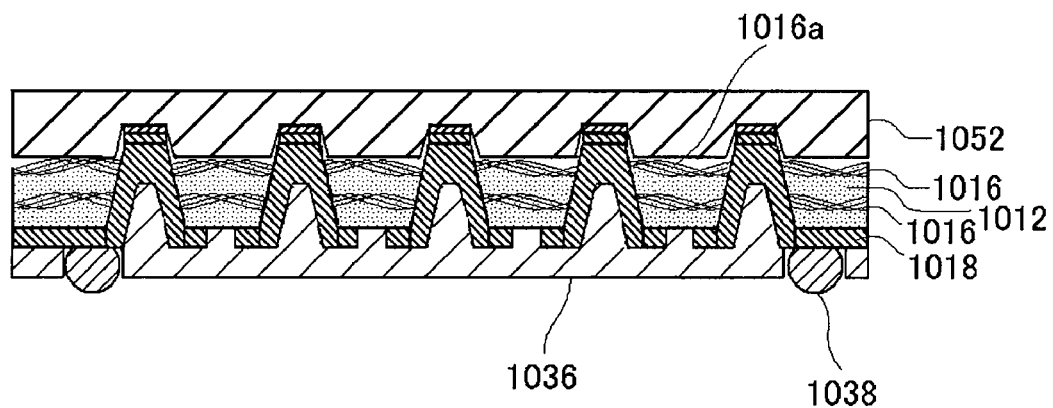

FIGS. 24A and 24B are sectional views showing the steps performed in the method of manufacturing the semiconductor module according to the seventh embodiment. First, as shown in FIG. 24A, a semiconductor device 1052 such as an LSI or an IC is mounted on the device mounting board 1050. In this process, a terminal 1054 of the semiconductor device 1052 is provided at a location receded from the surface of the semiconductor device 1052. Therefore, it is ensured that the exposed part 1016*a* is in contact with the surface of the semiconductor device 1052 when the semiconductor device 1052 is mounted on the device mounting board 1050, in which the electrode 1014 projects from the exposed part 1016*a*.

In other words, when the terminal 1054 of the semiconductor device 1052 as mounted is provided at a location receded from the surface, it is ensured that the surface of the semiconductor device 1052 on which the terminal 1054 is provided is in contact with the exposed part 1016*a* without removing a part of the via conductor 1030 to form the electrode 1014. Therefore, the steps are simplified.

Subsequently, as shown in FIG. 24B, the wiring layer 1018 is covered by a solder resist layer 1036. The solder resist layer 1036 functions as a protective film for the wiring layer 1018 and may comprise epoxy resin. A solder printing method is used form a bump 1038 that functions as a connection terminal for that part of the wiring layer 1018 exposed through the opening of the solder resist layer 1036. Thereby, the production of the semiconductor module 1300 is completed.

As shown in FIG. 24B, the semiconductor module 1200 is configured such that the exposed part 1016*a* of the glass cloth 1016 is in contact with the surface of the semiconductor device 1032 provided with the terminal 1034. Thus, the semiconductor module 1300 according to this embodiment is capable of dissipating heat from the semiconductor device 1052 via the glass cloth 1016 having a higher thermal conductivity than the resin of the insulating layer 1012.

The embodiments of the present invention are not limited to those described above by way of example and appropriate combinations or replacements of the structures of the embodiments are also encompassed by the present invention. The embodiments may be modified by way of design changes, etc. based on the knowledge of a skilled person, and such modifications are also within the scope of the present invention.

The description as described above is summarized as follows.

In the circuit device according to the embodiment, the filler is exposed through the major surface of the substrate (first insulating layer) on which a semiconductor device is flip-chip mounted. The underfill (second insulating layer) is allowed to be in contact with the filler. Accordingly, adhesion between the first resin layer and the second resin layer is improved due to the filler exposed through the first resin layer so that detachment of the first resin layer from the second resin layer is prevented in the face of a considerable temperature change resulting from the operation of the semiconductor device.

In further accordance with the embodiment, by employing a fibrous filler such as glass cloth as the filler, adhesion between the first resin layer and the second resin layer is further improved so that the likelihood of detachment is reduced.

In still further accordance with the embodiment, a part of the filler included in the first resin layer, which forms the substrate, is included in the second insulating layer. Therefore, the coefficient of thermal expansion of the second resin layer is reduced and thermal stress developed when the temperature changes is reduced.

In accordance with the inventive method, the conductive member embedded in the first resin layer is allowed to project outside and the filler included in the first resin layer is exposed outside, by etching the major surface of the first resin layer. The filler exposed outside from the first resin layer facilitates the improvement in adhesion between the first resin layer and the second resin layer.

The step of projecting the conductive member, which serves as an electrode, also exposes the filler. Therefore, adhesion between the first resin layer forming the substrate and the second resin layer is improved without increasing the number of steps. Advantageously, since the above step is performed by etching the first resin layer uniformly, the height of the bump and the degree that the filler is exposed are accurately controlled.

Since the mobile device according to the embodiment is built with the circuit device having the structure described above, the operation is ensured to be stable.

The invention claimed is:

1. A device mounting board comprising:
   an insulating layer made of an insulating resin and including a filler having a higher thermal conductivity than the resin; and
   an electrode provided in the insulating layer, wherein
   the filler has an exposed part and the electrode has an exposed part, both exposed parts being exposed on a first surface of the insulating layer, and
   the filler is configured to ensure that the height of at least a part of the exposed part is greater than the height of the exposed part of the electrode.

2. The device mounting board according to claim 1, further comprising a wiring layer formed on the exposed part of the electrode, wherein the electrodes includes a via conductor having the exposed part electrically connected to the wiring layer.

3. The device mounting board according to claim 1, further comprising:
   a first wiring layer formed on the first surface of the insulating layer so as to enable electrical connection with a semiconductor device; and
   a second wiring layer formed on a second surface of the insulating layer opposite to the first surface, wherein
   the electrode comprises a via conductor provided in the insulating layer and electrically connecting the first wiring layer and the second wiring layer.

4. The device mounting board according to claim 1, wherein the filler comprises glass fibers.

5. A semiconductor module comprising:
   a semiconductor device; and
   the device mounting board according to claim 1,
   wherein the exposed part of the filler is in contact with a surface of the semiconductor device.

* * * * *